United States Patent [19]

Murai et al.

[11] Patent Number: 4,586,247
[45] Date of Patent: May 6, 1986

[54] APPARATUS FOR INSERTING ELECTRONIC ELEMENTS

[75] Inventors: Toshiaki Murai; Takeshi Kawana; Toshio Asano, all of Yokohama, Japan

[73] Assignee: Hitachi, Ltd., Tokyo, Japan

[21] Appl. No.: 639,934

[22] Filed: Aug. 13, 1984

[30] Foreign Application Priority Data

Aug. 12, 1983 [JP] Japan .................. 58-146451

[51] Int. Cl.$^4$ .................. B23P 21/00; B23P 19/00; B23Q 15/00
[52] U.S. Cl. .................. 29/705; 29/33 K; 29/33 M; 29/709; 29/713; 29/729; 29/739; 29/759; 29/761; 414/730; 414/750
[58] Field of Search .................. 29/33 K, 33 M, 705, 29/709, 713, 729, 739, 740, 741, 759, 761, 809, 818, 27 A, 568; 414/730, 750

[56] References Cited

U.S. PATENT DOCUMENTS

| | | | |
|---|---|---|---|
| 3,355,800 | 12/1967 | Daugherty | 29/568 |
| 3,765,075 | 10/1973 | Olney, Jr. et al. | 29/739 X |
| 3,837,063 | 9/1974 | Wright | 29/739 X |
| 3,932,931 | 1/1976 | Wright | 29/739 X |
| 4,312,109 | 1/1982 | Kawana | 29/739 X |
| 4,419,797 | 12/1983 | Siglock et al. | 29/26 A |
| 4,464,833 | 8/1984 | Duncan | 29/709 X |
| 4,510,683 | 4/1985 | Fedde et al. | 29/709 X |

FOREIGN PATENT DOCUMENTS

| | | | |
|---|---|---|---|
| 27101 | 11/1969 | Japan | 29/741 |
| 132770 | 11/1978 | Japan | 29/741 |
| 199296 | 12/1982 | Japan | 29/741 |

OTHER PUBLICATIONS

"Multi-Function Computer-Controlled Component Inserter", IBM Technical Disclosure Bulletin, vol. 23, No. 2 (Jul. 1980) pp. 455–457

Primary Examiner—Howard N. Goldberg
Assistant Examiner—Ronald S. Wallace
Attorney, Agent, or Firm—Beall Law Offices

[57] ABSTRACT

An apparatus for inserting electronic elements comprises: a board positioning means having a pair of rails disposed on an X-Y table, the board positioning means being adapted to fix and position a board which is fed thereto along the rails; an element supply means having a plurality of element supply units each adapted to feed to its element supply position an electronic element to be inserted in the board, the element supply units being arranged such that their element supply positions are placed in one or a plurality of rows; a plurality of chucks each formed such as to correspond to the configuration and size of the associated electronic elements to be inserted; an inserting head having a holder mechanism and adapted to detachably support one of the chucks by the holder mechanism and to reciprocatively move between a chuck exchanging position and element supply and insertion positions; and a chuck exchanging means including a chuck unit in which the chucks are arranged on an index-movable plate and a chuck exchanging unit which is adapted to actuate the holder mechanism of the inserting head thereby to load and unload the chuck.

10 Claims, 56 Drawing Figures

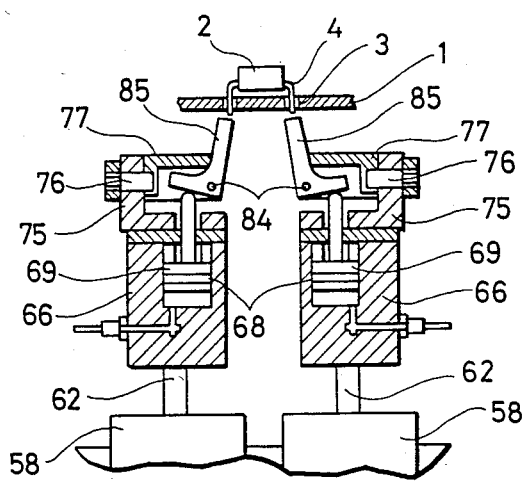
FIG. 11
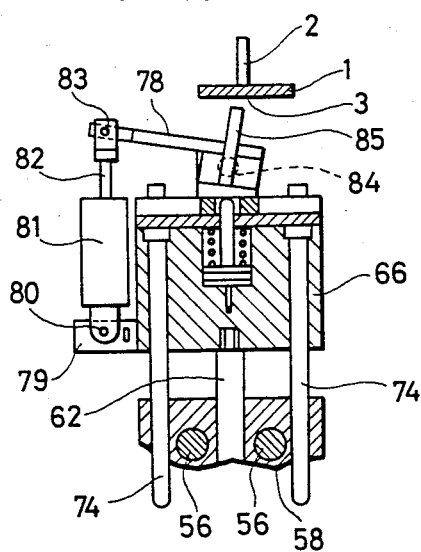
FIG. 12
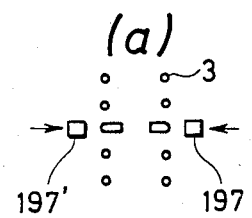
FIG. 13
(a)
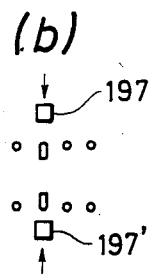
(b)
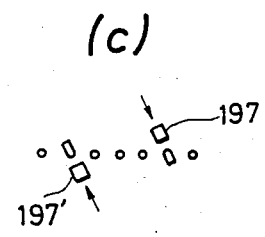
(c)
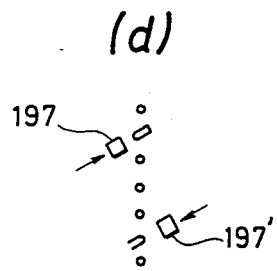
(d)

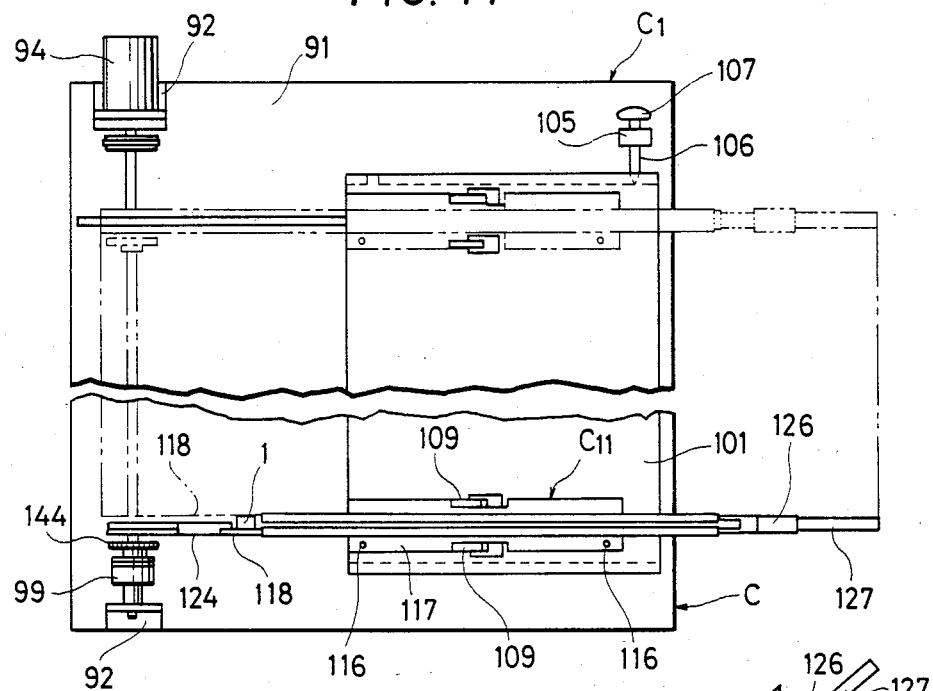
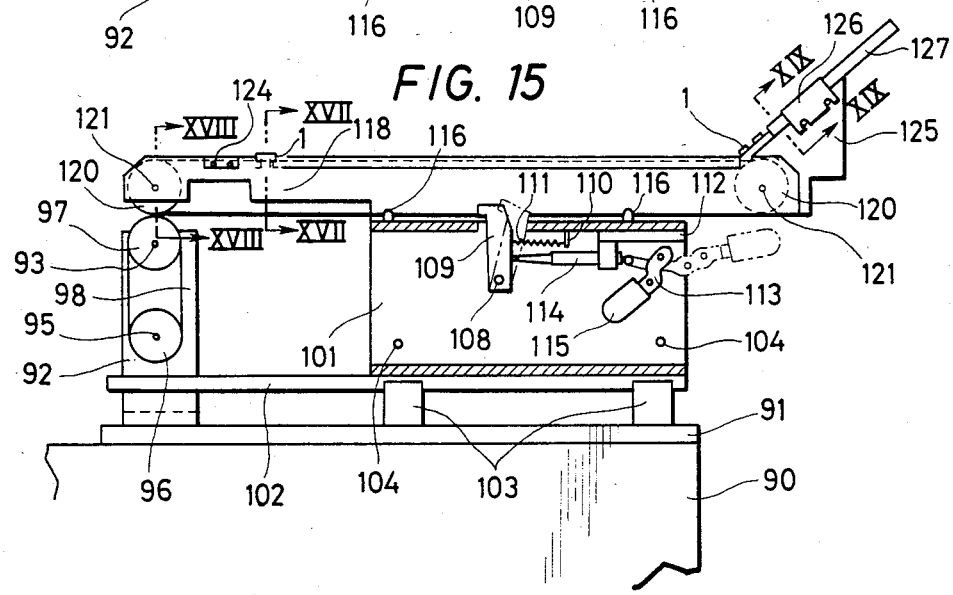

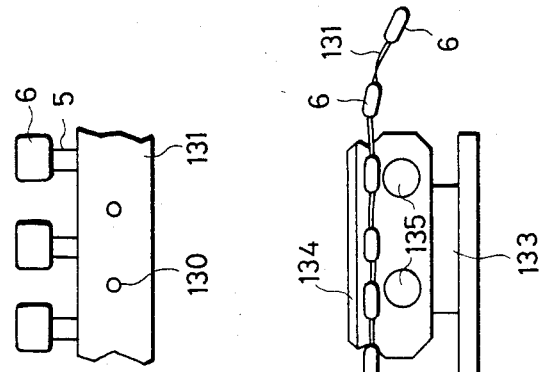
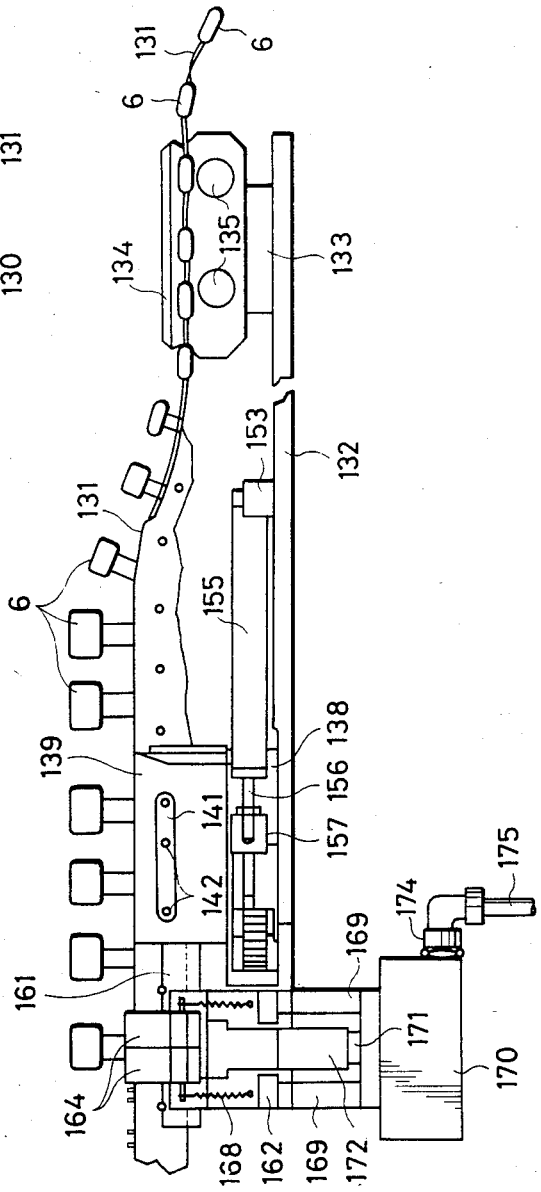
FIG. 20
FIG. 21

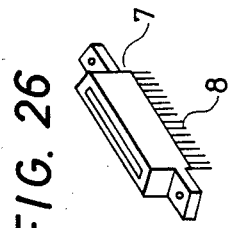
FIG. 26
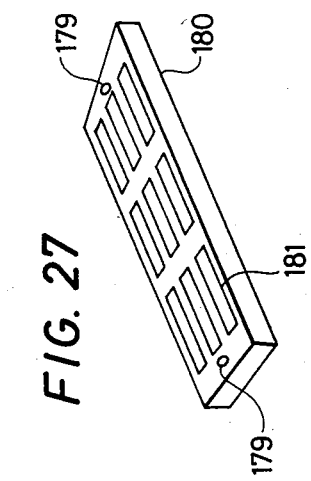
FIG. 27
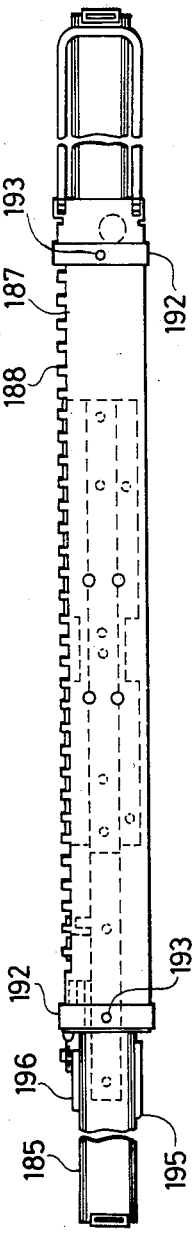
FIG. 28
FIG. 29

APPARATUS FOR INSERTING ELECTRONIC ELEMENTS

BACKGROUND OF THE INVENTION

The present invention relates to an electronic-element inserting apparatus which is made capable of inserting in a printed circuit board (referred to simply as a "board", hereinafter) a great variety of electronic elements which are different in configuration and, more particularly, to an electronic-element inserting apparatus which is suitable for large variety-small lot production.

Examples of the electronic elements which are inserted in a board include taped vertical-type or horizontal-type electronic elements (referred to simply as "elements", hereinafter), package-type electronic elements such as ICs, variable resistors and variable capacitors, and special-form elements (referred to as "special-form elements" or simply as "elements", hereinafter) such as sockets which detachably support the above-mentioned electronic elements.

As an example of the apparatus for inserting these elements in a board, an assembling apparatus was mentioned in Japanese Patent Laid-Open No. 132,770/1978. This assembling apparatus is arranged such that a plurality of different kinds of elements are aligned, according to a predetermined order, on an element conveying means which feeds the elements to a supply position, and are unloaded from the element conveying means by means of chucks arranged according to a predetermined order and are then inserted in the board. It is, therefore, necessary to change the arrangement of the chucks when the element inserting order is changed. Further, when elements to be inserted are changed, it is also necessary to change the chucks correspondingly. Accordingly, the conventional assembling apparatus requires an inconveniently long time for changing the arrangement of its mechanism and therefore is not suitable for large variety-small lot production.

Another example of the element inserting apparatus hitherto proposed is a mounting apparatus which was disclosed in Japanese Patent Laid-Open No. 199,296/1982. The mounting apparatus is arranged such that an inserting head and a tentative fixing means which are integrally connected to each other are moved in relation to an element supply position and a board which are located at their respective fixed positions whereby elements are inserted in the board. In such a mounting apparatus, since the element mounting operation involves moving an element mounting head and an anvil head which are connected to each other, the weight of the moving part is increased such as to produce a large inertia, which in turn makes it difficult to increase the speed of the element mounting operation. In addition, the mounting apparatus has the disadvantage that it is not possible to quickly cope with a change in, for example, configuration and size of elements to be inserted.

To overcome the above-described disadvantages, an apparatus has been proposed which was disclosed as a "Multi-Function Computer-Controlled Component Inserter" in IBM Technical Disclosure Bulletin Vol. 23 No. 2, July 1980. This apparatus is similar to the mounting apparatus disclosed in Japanese Patent Laid-Open No. 199,296/1982 but is additionally provided with a plurality of different kinds of element-handling chucks such as to allow the chucks to be changed according to the configuration and size of elements to be handled. In this apparatus, however, it is still difficult to increase the speed of the element inserting operation. In addition, the tentative element fixing means of the apparatus disadvantageously limits the number of different kinds of elements which can be inserted.

In each of the above-described apparatuses, furthermore, the inserted condition of an element is judged to be good or bad by detecting the force applied in cutting or bending the lead of the element by the tentative fixing means or the contact between the tentative fixing means and the lead. Accordingly, the inserted condition of the element cannot be judged before the inserting head has finished an inserting operation. Therefore, when any inserting failure occurs due to, for example, bending of the lead of an element or misalignment between the lead and the corresponding hole in the board, accidents easily happen such as damage to the element or the board. In consequence, a costly board or element may be wasted, and the apparatus may disadvantageously be required to suspend operations in order to allow for the damaged board or element to be removed, thus causing a reduction in working efficiency.

BRIEF SUMMARY OF THE INVENTION

Accordingly, it is a primary object of the present invention to provide an electronic element inserting apparatus which is capable of efficiently inserting various kinds of electronic elements that are different in configuration and size, thereby to overcome the above-described disadvantages of the prior art.

To this end, according to the present invention, there is provided an apparatus for inserting electronic elements comprising: a board positioning means disposed at an element insertion position where the electronic elements are inserted in a board, the board positioning means being adapted to move in the X-Y directions while retaining the board so as to position the board; a tentative fixing means disposed at the element insertion position and below the retained board and adapted to support a pair of members for bending leads such that the bending members are movable toward and away from each other and are pivotal about a line perpendicular to the board; an element supply means disposed at a supply position for supplying the electronic elements, the element supply means having a plurality of element supply units which are arranged such that their element supply positions are placed in one or a plurality of rows; a plurality of chucks each formed such as to correspond to the configuration and size of the associated elements to be inserted; a chuck exchanging means disposed at a chuck exchanging position and having the chucks provided on an index-movable support member thereof, the chuck exchanging means being adapted to allow the chucks to be exchanged with each other; and an inserting head adapted to detachably support one of the chucks and to reciprocatively move between the above-mentioned positions thereby to transfer an electronic element from the supply position to the board and to insert the former in the latter.

Further, the present invention provides an electronic-element inserting apparatus of the type described above, additionally comprising a lead detecting means disposed between the element supply and insertion positions and adapted to detect the position of a lead of an electonic element which is transferred from the element supply position to the element insertion position, wherein the X-Y table is moved on the basis of the result of detection effected by the lead detecting means in order to correct the position of the board, thereby to effect alignment between the position of the lead of the element and an element inserting hole in the board.

Further, the present invention provides an electronic-element inserting apparatus of the type described above, additionally comprising a board hole position detecting means disposed such as to be movable toward and away from the lead inserting hole in the board which is positioned at the element insertion position, the board hole position detecting means being adapted to measure the position of the hole, wherein, after the board is positioned by means of the X-Y table, the position of the board is corrected on the basis of the result of hole detection effected by the board hole position detecting means, and further, the position of the board is corrected on the basis of the result of detection effected by the lead detecting means. The provision of the board hole position detecting means makes it possible to effect insertion of an electronic element even if the position of the element inserting hole in the board is offset due to, for example, thermal expansion or machining errors.

Further, the present invention provides an electronic-element inserting apparatus of the type described above, additionally comprising an inserted condition detecting means attached to the inserting head and adapted to apply a predetermined element inserting force to the inserting head when an electronic element is inserted and to detect the inserted condition of the element, wherein the inserted condition of the element is judged to be good or bad according to whether or not a predetermined depth of insertion is achieved with a predetermined period of time, or whether or not the inserting force reaches a predetermined value within a predetermined period of time. Since the inserted condition of the element can be judged to be good or bad as described above, it is possible to replace any defective electronic element with a new one when the inserted condition is judged to be bad and to effect reinsertion with the new element. Accordingly, insertion errors can be reduced in number.

BRIEF DESCRIPTION OF THE DRAWINGS

FIGS. 11 and 12 are illustrations showing the operation of the tentative fixing means;

FIGS. 13a–13d are illustrations showing how a lead is bent by the tentative fixing means;

FIG. 14 is a plan view of a first example of an element supply unit which constitutes an element supply means;

FIG. 15 is a vertical sectional view of the first example of the element supply unit shown in FIG. 14;

FIG. 20 is a front elevational view of one example of an element which can be inserted by the apparatus in accordance with the present invention;

FIG. 21 is a front elevational view of an element supply unit for supplying the element shown in FIG. 20;

FIG. 26 is a perspective view of one example of an element which can be inserted by the apparatus in accordance with the present invention;

FIG. 27 is a perspective view of one example of a magazine which houses the element shown in FIG. 26;

FIG. 28 is a plan view of an element supply unit for supplying the element shown in FIG. 26;

FIG. 29 is a front elevational view of the element supply unit shown in FIG. 28;

DETAILED DESCRIPTION OF THE PREFERRED EMBODIMENT

One embodiment of the present invention will be described hereinunder with reference to the accompanying drawings.

Figure 1:
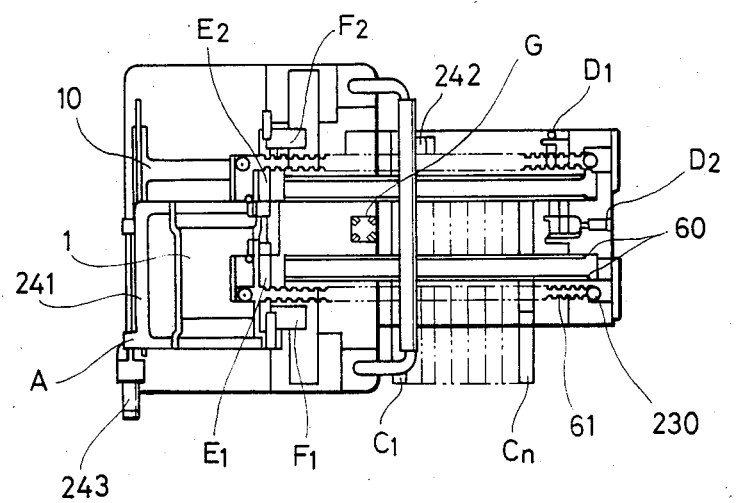
FIG. 1 is a plan view of an electronic element inserting apparatus in accordance with the present invention.
Figure 2:
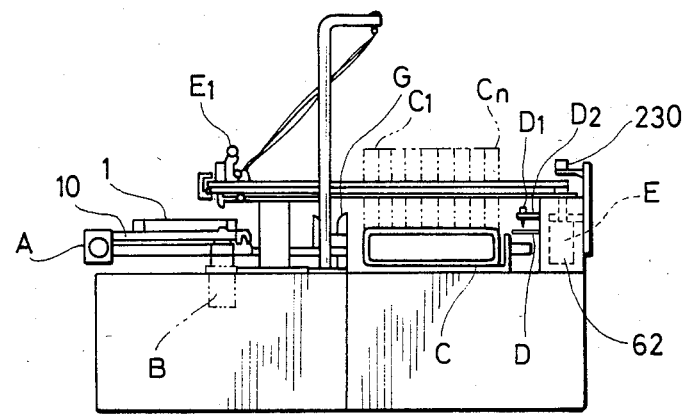
FIG. 2 is a side elevational view of the electronic element inserting apparatus shown in FIG. 1.
Figure 53:
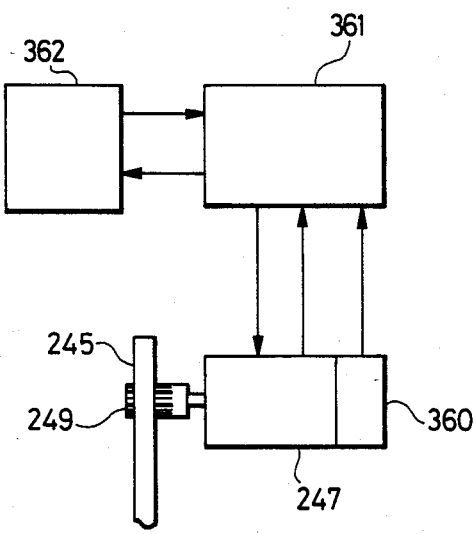
FIG. 53 is a block diagram of an inserted condition detecting means employed in the apparatus in accordance with the present invention.

Referring to FIGS. 1 to 53 which in combination show one embodiment of the present invention, an electronic element inserting apparatus comprises: board positioning means A; a tentative fixing means B; an element supply means C; a chuck exchanging means D; an inserting head E ($E_1$, $E_2$); a chuck F; a head positioning means G ($G_1$, $G_2$); a lead detecting means H; a board hole position detecting means J; and an inserted condition detecting means K. The board positioning means A moves a board 1 retained thereon in the X-Y directions thereby to position the board. The tentative fixing means B is disposed at an electronic element inserting position such as to be located below the board 1 retained by the board positioning means A and is adapted to bend a lead of an electronic element inserted in the board 1 thereby to tentatively fix the element to the board 1. The element supply means C has element supply units $C_1$ to $C_n$ each of which successively feeds electronic elements housed therein to its element supply position, the element supply units $C_1$ to $C_n$ being arranged such that their respective element supply positions are aligned in a row. The chuck exchanging means D is composed of a chuck unit $D_1$ which supports a plurality of chucks in accordance with, for example, the size and configuration of electronic elements supplied from the element supply means C, and a chuck exchanging unit $D_2$ which allows the chucks to be exchanged with one another. The inserting head E ($E_1$, $E_2$) is adapted to detachably support a chuck and to reciprocate between the element supply and insertion positions thereby to transfer an element supplied to the supply position to the insertion position in order to insert the element in the board 1. The chuck F is held by the inserting head E and is adapted to clamp and unclamp the element to be inserted. The head positioning means G ($G_1$, $G_2$) effects positioning of the inserting head E which has reached the insertion position. The lead detecting means H is supported by the inserting head E and is disposed along the passage of the lead of the element which is transferred to the insertion position and is further adapted to detect the displacement amount of the lead of the element. The board hole position detecting means J detects the position of each hole in the board 1 which is positioned at the insertion position. Further, the inserted condition detecting means K is adapted to push the element into the board 1 with a predetermined force and to detect the inserted condition of the element.

Figure 4:
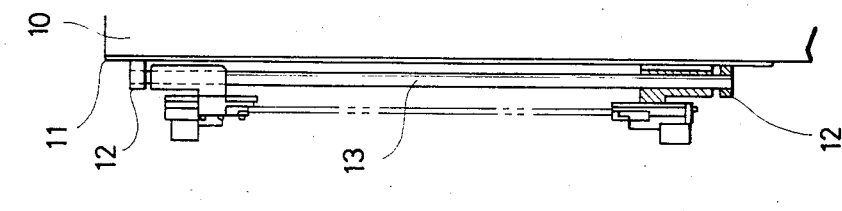
FIG. 4 is a side elevational view of the board positioning means shown in FIG. 3.
Figure 3:
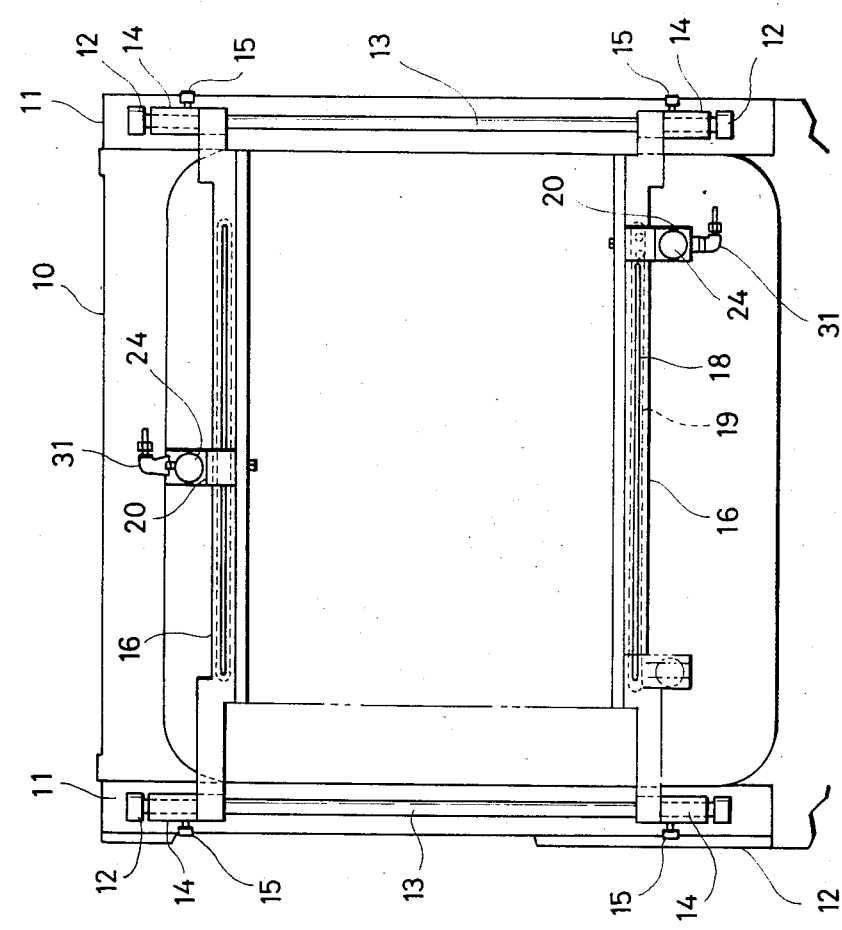
FIG. 3 is a plan view of a board positioning means employed in the electronic element inserting apparatus shown in FIG. 1.
Figure 5:
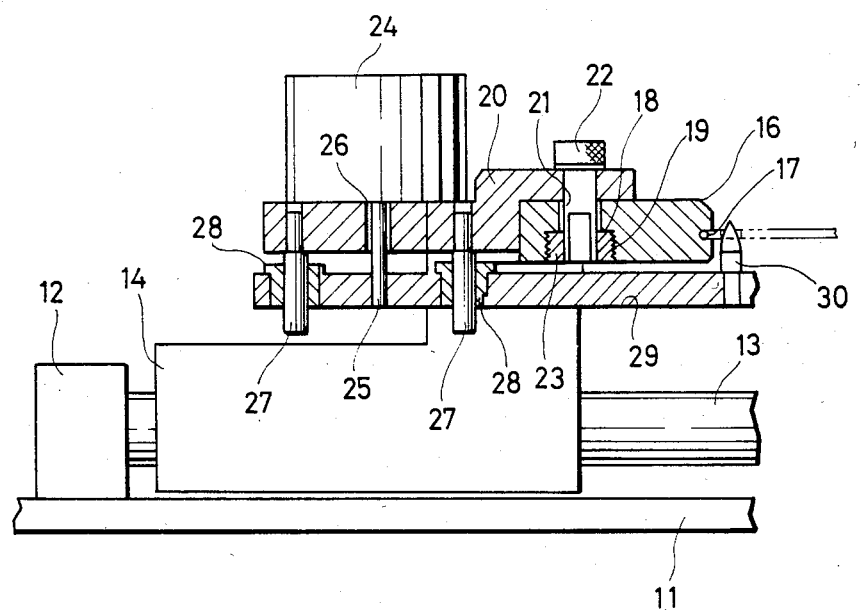
FIG. 5 is an enlarged view of an essential part of the board positioning means shown in FIG. 4.
Figure 6:
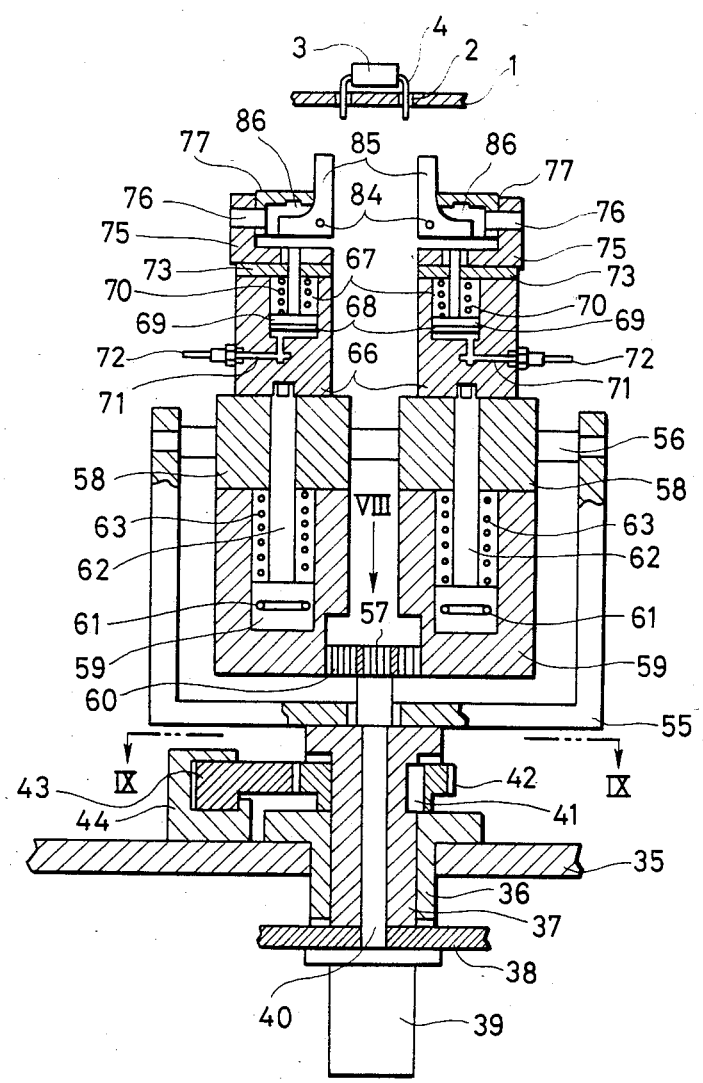
FIG. 6 is a vertical sectional view of a tentative fixing means employed in the electronic element inserting apparatus shown in FIG. 1.
Figure 7:
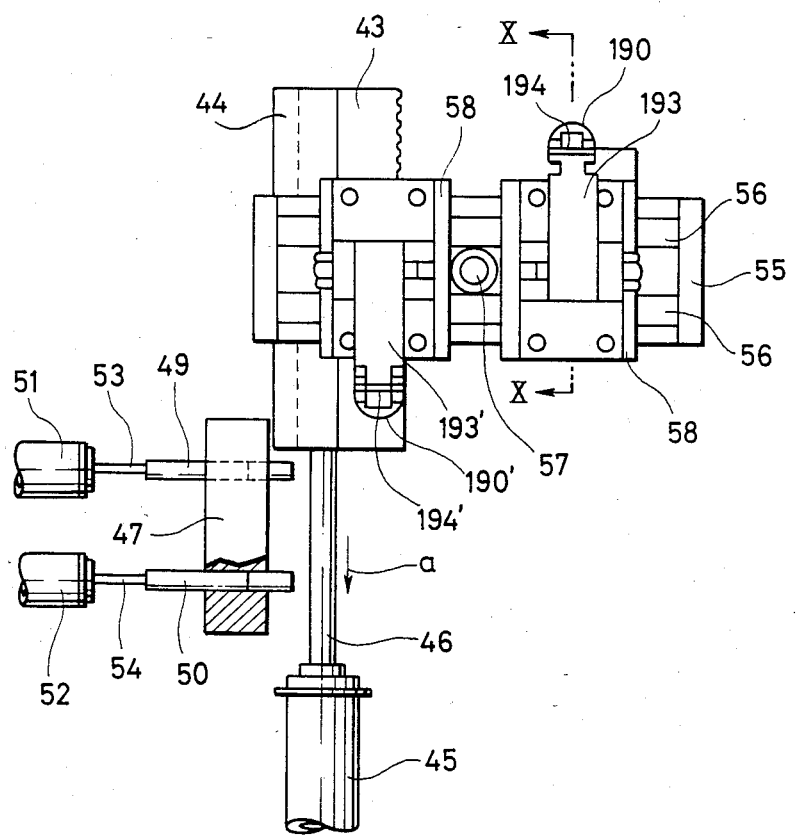
FIG. 7 is a partly-sectioned plan view of the tentative fixing means shown in FIG. 6.

The board positioning means A is, as shown in FIGS. 3 to 5, composed of an X-Y table 10 and a board retaining unit which is supported on the X-Y table 10. A pair of plates 11 are secured to the upper side of the X-Y table 10. Each of the plates 11 has a pair of bearings 12 which are respectively secured to both end portions thereof. A shaft 13 is supported by each pair of bearings 12. Moreover, a pair of sliders 14 are slidably supported by each shaft 13. Each slider 14 is secured to the associated shaft 13 by means of a screw 15 which is provided on one of the side surfaces of the slider 14. Rails 16 are respectively supported by the sliders 14 such as to oppose each other in parallel. The rails 16 are respectively provided on their opposing surfaces with grooves 17 in which the board 1 is slidably fitted. Moreover, each of the rails 16 is formed in the longitudinal direction thereof with a slot 18 and a groove 19 which communicates with the slot 18. One end of a holder 20 is mounted on each rail 16. Each holder 20 is formed with a bore 21 which communicates with the slot 18 of the associated rail 16. Through the bore 21, a bolt 22 is received such as to project into the groove 19. The bolt 22 has one end thereof screwed with a nut 23 which slidably fits in the groove 19, whereby the holder 20 is fixed to the associated rail 16 by tightening the bolt 22 and is allowed to slide in relation to the rail 16 when the bolt 22 is loosened. A rod 25 of a cylinder 24 which is supported on the upper surface of each holder 20 is slidably received through a bore 26 formed in the holder 20. Further, a pair of guide posts 27 are provided on the lower surface of each holder 20 such as to be parallel to the rod 25. A guide pin 30 is provided on a guide pin holder 29 which is fixedly supported by the rod 25 and bushes 28 which slidably fit on the respective guide posts 27. Accordingly, the guide pin 30 is raised and lowered by the operation of the cylinder 24 such as to fit in a reference hole in the board 1 which is inserted in the groove 17, thereby to effect positioning and fixing of the board 1. It is to be noted that the reference numeral 31 denotes a pipe for supplying and discharging compressed air in relation to each cylinder 24.

Figure 8:
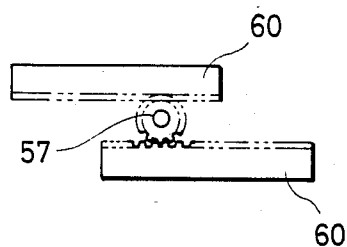
FIG. 8 is an illustration of the tentative fixing means as viewed in the direction of the arrow VIII in FIG. 6.
Figure 9:
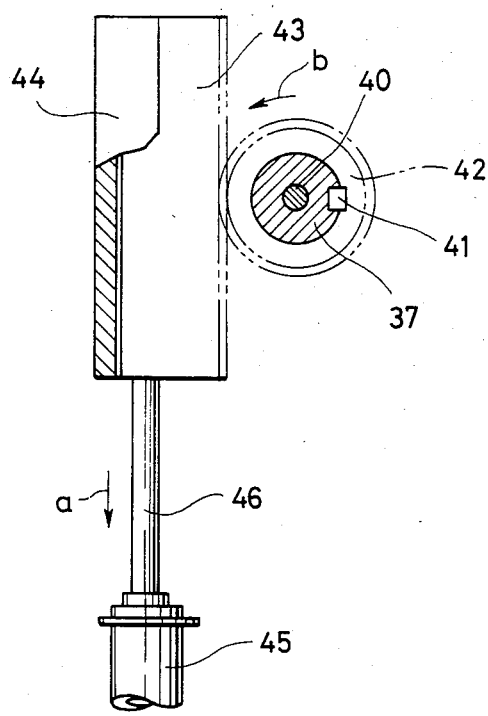
FIG. 9 is an illustration of the tentative fixing means as viewed in the direction of the arrows IX—IX of FIG. 6.
Figure 10:
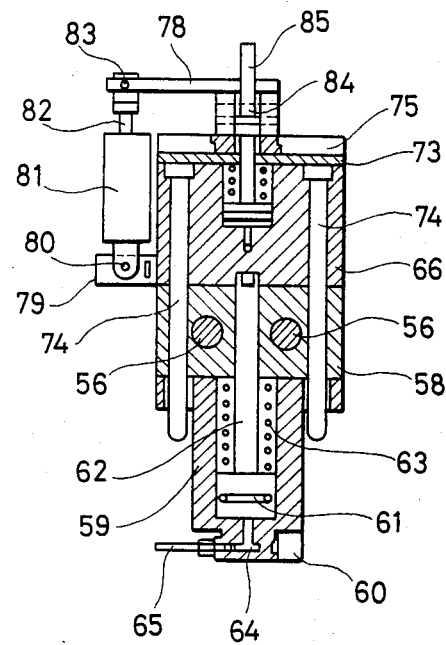
FIG. 10 is an illustration of the tentative fixing means as viewed in the arrows X—X in FIG. 7.
Figure 16:
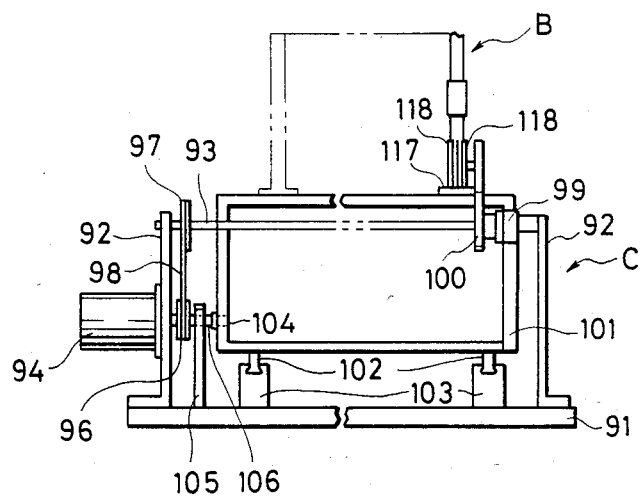
FIG. 16 is a side elevational view of the first example of the element supply unit shown in FIG. 14.
Figure 17:
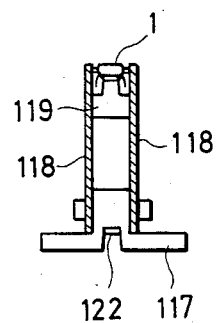
FIG. 17 is a sectional view taken along the line XVII—XVII of FIG. 15.
Figure 18:
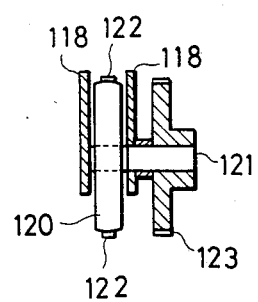
FIG. 18 is a sectional view taken along the line XVIII—XVIII of FIG. 15.
Figure 19:
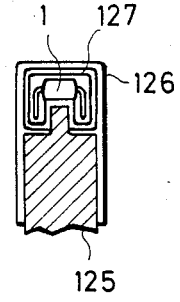
FIG. 19 is a sectional view taken along the line XIX—XIX of FIG. 15.
Figure 22:
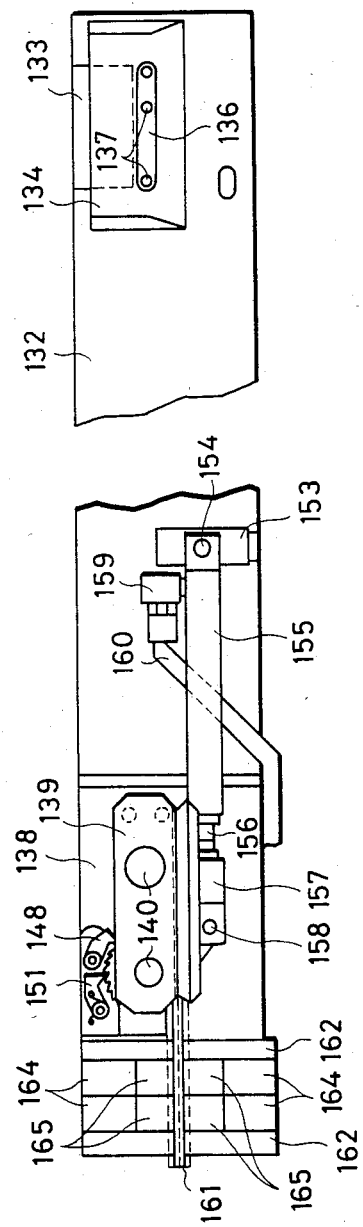
FIG. 22 is a plan view of the element supply unit shown in FIG. 21.
Figure 23:
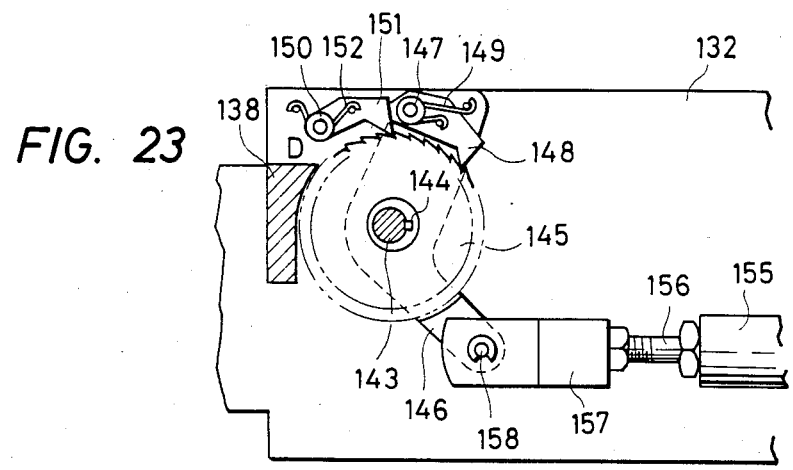
FIG. 23 is an enlarged view of a drive system of the element supply unit shown in FIG. 22.
Figure 24:
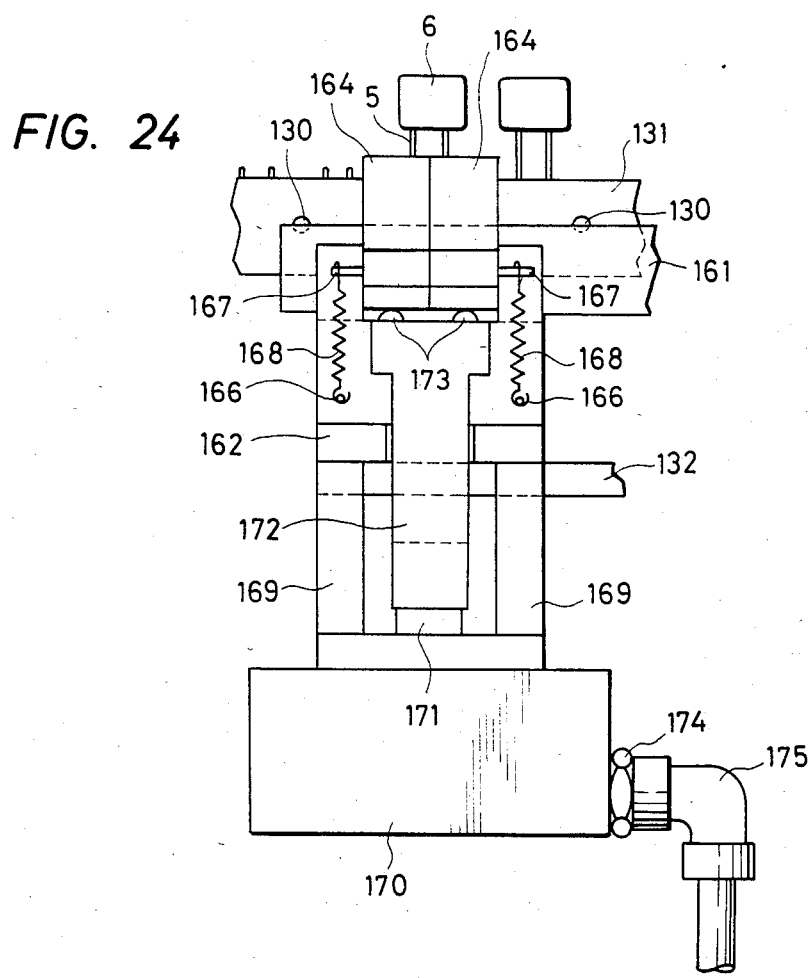
FIG. 24 is an enlarged view of the cutting mechanism part of the element supply unit shown in FIG. 21.
Figure 25:
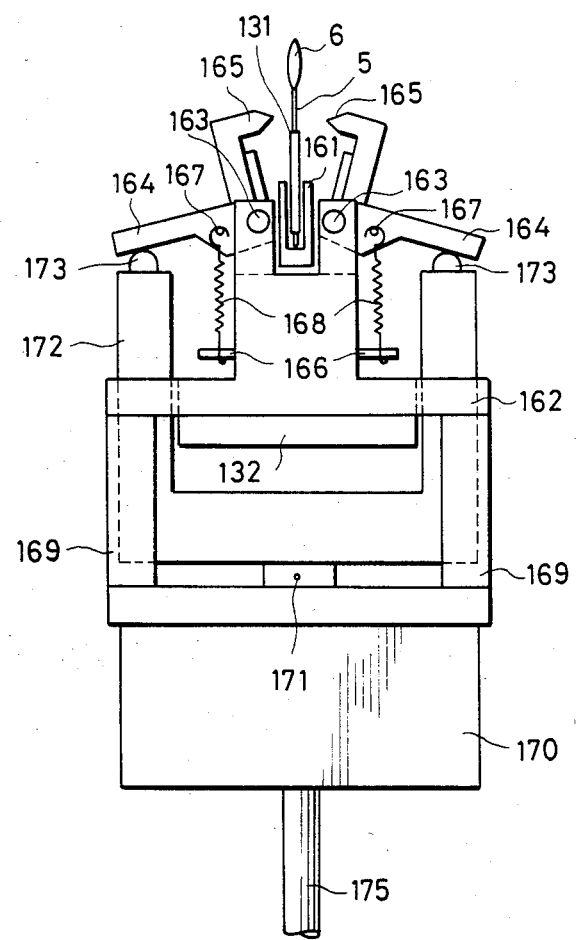
FIG. 25 is a side elevational view of the cutting mechanism part shown in FIG. 24.
Figure 32:
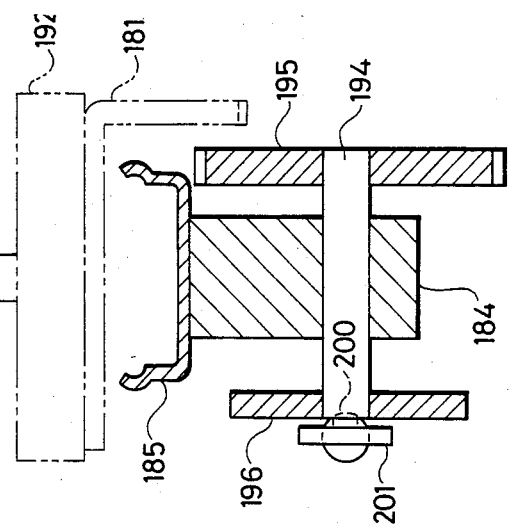
FIG. 32 is a sectional view taken along the line II—II of FIG. 30.
Figure 30:
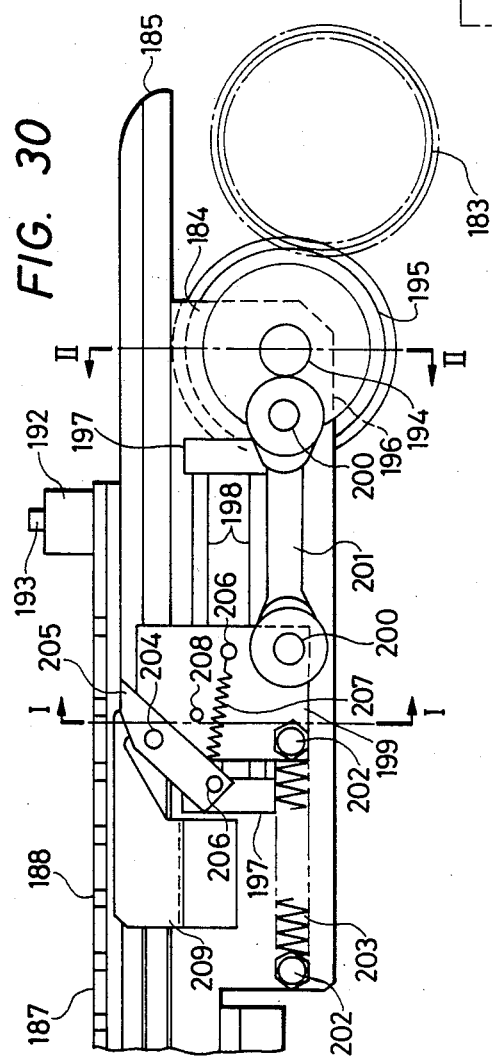
FIG. 30 is an enlarged view of the drive system of the element supply unit shown in FIG. 28.
Figure 31:
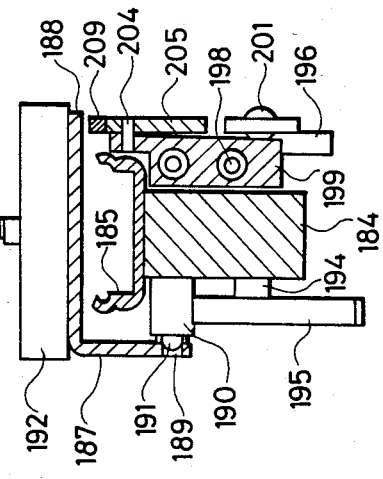
FIG. 31 is a sectional view taken along the line I—I of FIG. 30.

The tentative fixing means B is, as shown in FIGS. 6 to 13, disposed such as to be located at an insertion position for inserting an element 3 and below the board 1. A hollow shaft 37 is provided such as to rotatably extend through the center of a housing 36 which is secured to a base 35. The shaft 37 supports at the lower end thereof a motor 39 through a plate 38. A shaft 40 connected to the rotating shaft of the motor 39 is rotatably received through both the plate 38 and the shaft 37. A pinion 42 is secured to the shaft 37 through a key 41. A rack 43 meshing with the pinion 42 is slidably guided by means of a guide 44 which is secured to the base 35. The rack 43 is connected to a rod 46 of a cylinder 45 which is disposed on the base 35 such as to be slid by the operation of the cylinder 45. In this case, as the rack 43 is moved, for example, in the direction of the arrow a as shown in FIG. 9, the pinion 42 is rotated in the direction of the arrow b, thereby allowing the shafts 37 and 40 to be rotated in the direction of the arrow b. A guide 47 is disposed on the base 35 along the rod 46 such as to slidably support a pair of stoppers 49, 50. These stoppers 49, 50 are connected to respective rods 53, 54 of cylinders 51, 52 supported by the base 35 and are adapted to project into the moving path of the rack 43 by the operations of the cylinders 51, 52 such as to limit the movement of the rack 43. A U-shaped frame 55 is supported on the upper end of the shaft 37. A pair of parallel guide bars 56 are supported in the opening of the frame 55. The upper end of the shaft 40 projects inside the frame 55 and has a pinion 57 secured thereto. A pair of blocks 58 are slidably supported on the guide bars 56. A cylinder block 59 is supported below each of the blocks 58. A rack 60 extending from the lower end of each cylinder block 59 is meshed with the pinion 57 as shown in FIG. 8. Accordingly, as the motor 39 is actuated, the pinion 57 is rotated through the shaft 40 to cause the racks 60 to move, whereby the cylinder blocks 59 and the blocks 58 can be moved along the guide bars 56 such as to come toward and away from each other. Inside each cylinder block 59, a piston 62 equipped with an O-ring 61 is mounted such as to be downwardly urged by means of a spring 63. The piston 62 is slidably received through the corresponding block 58 and has one end thereof projecting beyond the upper end of the block 58. The cylinder block 59 is formed at the lower end thereof with a compressed air supply port 64 which is connected with a pipe 65 for supplying and discharging compressed air. On each of the blocks 58 is disposed a lifting block 66 which is connected to the upper end of the piston 62. The lifting block 66 is formed with a hole 67, which receives a piston 69 equipped with an O-ring 68, together with a spring 70. The hole 67 is formed at the lower end thereof with a compressed air supply port 71 which is connected with a pipe 72 for supplying and discharging compressed air. A cover 73 is attached to the upper end of the lifting block 66. Further, guide pins 74 provided on the lifting block 66 are slidably received through the block 58. Accordingly, the lifting block 66 is raised or lowered in response to the movement of the piston 62. On the cover 73 is supported a bracket 75 which is provided with a pin 76 in the horizontal direction. The pin 76 rotatably supports a rotary block 77. An arm 78 extending from the rotary block 77 is rotably connected to a bracket 79 projected from one of the side surfaces of the lifting block 66 through a pin 83 and a rod 82 of a cylinder 81 which is rotatably supported by the bracket 79 through a pin 80. Accordingly, as the cylinder 81 is actuated, the rotary block 77 is rotated about the pin 76 such as to bend a lead as shown in FIG. 12. An L-shaped bending member 85 which is pivotally supported by each rotary block 77 through a pin 84 is urged by means of a spring 86 and has one side thereof standing vertically. The other side of the bending member 85 is extended such as to oppose the upper end of the associated piston 69. Accordingly, as the piston 69 is actuated, the bending member 85 is pivoted about the pin 84 such as to bend the lead 2. Such an arrangement makes it possible to properly change the distance between the bending members 85 and the bending direction of the lead 2 and therefore is able to cope with the need for insertion of any kind of element 3. For example, the lead 2 of a IC is bent as shown in FIG. 13.

The element supply means C has an element supply unit $C_1$ ($C_{11}$ to $C_{1n}$) which supplies special-form elements housed in a stick-shaped casing, an element supply unit $C_2$ ($C_{21}$ to $C_{2n}$) which supplies taped elements, and an element supply unit $C_3$ which supplies special-form elements planarly arranged in a box.

The element supply unit $C_1$ is disposed on a base 90 as shown in FIGS. 14 to 19. A shaft 93 is rotatably supported through a pair of bearings 92 by a plate 91 which is installed on the base 90. A motor 94 is supported by one of the bearings 92 and is arranged such that the rotation of the motor 94 is transmitted to the shaft 93 by means of a belt 98 which is stretched between a pulley 96 secured to a rotating shaft 95 of the motor 94 and a pulley 97 secured to the shaft 93. On the shaft 93 is disposed a plurality of electromagnetic clutches 99 and gears 100 in pairs each of which is rotatably supported in relation to the shaft 93. The arrangement is such that when the electromagnetic clutch 99 is actuated, the gear 100 is rotated with the shaft 93. A box-shaped base 101 has a pair of rails 102 which are outwardly projected from the bottom surface thereof and are slidably fitted in their respective guides 103 which are provided on the plate 91. A pair of holes 104 are formed in one of the side surfaces of the base 101. Each hole 104 is detachably fitted with a pin 106 which is slidably supported by a bearing 105 provided on the plate 91. An operating knob 107 is secured to one end of the pin 106. Inside the base 101, a plurality of levers 109 are pivotally supported by a shaft 108 such that one end of each lever 109 projects beyond the upper surface of the base 101. Each lever 109 is urged so as to pivot by means of a spring 111 which is stretched between the lever 109 and a pin 110 provided on the base 101. A push rod 114 contacting the lever 109 is connected to the free end of a toggle mechanism 113 which is supported by a plate 112 secured inside the base 101. Thus, the push rod 114 is slidably supported by the plate 112 and is arranged such as to be reciprocated by the actuation of a lever 115, thereby to rotate the lever 109. Positioning pins 116 are projected from the upper surface of the base 101. To a base 117, which is formed with holes respectively fitted with the positioning pins 116, is secured a pair of side plates 118 each having a portion of its upper end bent in an L shape. A guide 119 is secured between the side plates 118. Between the side plates, additionally, a pair of pulleys 120 are rotatably supported by respective shafts 121. An element conveying belt 122 is stretched between the pulleys 120 such as to contact the upper surface of the guide 119 and to pass below the base 117. A gear 123 is secured to one of the shafts 121 and is adapted to mesh with the gear 100 when the base 117 is set on the base 101 and the latter is set at the supply position. Accordingly, with the base 101 set at the supply position, when the electromagnet clutch 99 is actuated to rotate the gear 100, the pulleys 120 are rotated through the gear 123 and the shafts 121 such as to rotate the belt 122, thereby allowing special-form elements 1 on the belt 122 to be conveyed. It is to be noted that, when conveyed, each special-form element 3 has its main body mounted on the belt 122 and its leads 2 located on both sides of the belt 122. Each special-form element 3 being conveyed by the belt 122 stops by abutting against a stopper 124 which is secured to the side plates 119. A chute 125 is fixed at one end of the side plates 118 and is provided with a retainer member 126. A stick-shaped casing 127 accommodating the special-form elements 3 is secured to the chute 125 by the retainer member 126. In this case, the casing 127 is mounted at such an angle that the special-form elements 3 slide down by virtue of their own weight, so that the special-form elements 3 slide down to the belt 122 along the chute 125.

With the above-described arrangement, the element supply unit $C_{11}$ can be upwardly removed by pulling the lever 115 of the toggle mechanism 113 in order to pivot the lever 109. On the other hand, the element supply unit $C_{11}$ is secured to the base 101 by fitting the element supply unit $C_{11}$ on the base 101 with the lever 115 pulled and then pushing the lever 115 in order to pivot the lever 109 in the direction opposite to that which applies when removing the unit $C_{11}$. Then, with the pins 106 removed, the base 101 is pushed such as to move to the supply position, thereby allowing the supply of the special-form elements 3 to be commenced.

It is to be noted that a detector means may be provided such as to detect a special-form element which has abutted against the stopper 124.

The element supply unit $C_2$ ($C_{21}$ to $C_{2n}$) for supplying a taped element 6 having a lead 5 attached to a tape 131 formed with holes 130 at a predetermined pitch as shown in FIG. 20 is supported by a base 132 as shown in FIGS. 21 to 25. The base 132 is supported on a base which is similar to the base 101 for the element supply unit $C_1$. The illustration and description of the base for the base 132 are, however, omitted. The tape 131 taping a multiplicity of elements 6 is disposed in zigzag fashion at a predetermined spacing and is contained in a box (not shown). A guide 134 is mounted on one end of the base 132 through a plate 133. In the guide 134 are incorporated timing pulleys (not shown) which are rotatably supported by a pair of shafts 135, a timing belt 136 which is stretched between the timing pulleys, and pins 137 which are provided on the timing belt 136 at the same spacing as that of the holes 130 in the tape 131. Accordingly, it is possible to limit the path of the tape 131 by fitting the pins 137 into the holes 130 in the tape 131 which is drawn out of the box. A plate 138 is also secured to the end of the base 132 on the side thereof which is closer to the supply position. A guide 139 which is similar to the guide 134 is supported on the plate 138. More specifically, in the guide 139 are incorporated timing pulleys (not shown) which are respectively secured to a pair of rotatable shafts 140, a timing belt 141 which is stretched between the timing pulleys, and pins 142 provided on the timing belt 141, the pins 142 being adapted to fit in the holes 130 in the tape 131. One of the shafts 140 is connected to a shaft 143 which is rotatably supported by the base 132. The shaft 143 is connected with a ratchet wheel 145 through a key 144. Below the ratchet wheel 145, a lever 146 is pivotally supported by the shaft 143. A ratchet pawl 148 is pivotally supported by the lever 146 through a pin 147 and is urged by a torsion spring 149 such as to contact the ratchet wheel 145. Moreover, a ratchet pawl 151 is pivotally supported by a pin 150 provided on the base 132 and is urged by a torsion spring 152 such as to contact the ratchet wheel 145, thereby to prevent any reverse rotation of the ratchet wheel 145. The other end of the lever 146 is rotatably connected through a pin 158 to a piece 157 provided at the distal end of a rod 156 of a cylinder 155 which is rotatably supported through a pin 154 by a plate 153 secured to the base 132. The cylinder 155 has a compressed air supply port 159 which is connected with a pipe 160 for supplying and discharging compressed air. Accordingly, when the rod 156 is moved by the operation of the cylinder 155, the lever 146 is pivoted to rotate the ratchet wheel 145. Consequently, the shaft 143, the shafts 140, the timing pulleys and the timing belt 141 are rotated such as to feed the tape 131 by one pitch, thereby allowing one of the elements 6 to be fed to the supply position. A U-shaped rail 161 is laid on the guide 139 such as to prevent bending of the fed tape 131. Cutter levers 164 are pivotally supported through respective pins 163 on a plate 162 which is secured to the end portion of the base 132 on the side thereof which is closer to the supply position. A cutting edge 165 is formed at the upper end of each of the levers 164. Springs 168 are respectively stretched between pins 166 provided on the plate 162 and pins 167 respectively provided on the levers 164 in order to urge the levers 164 in such a direction that the cutting edges 165 are expanded or moved away from each other. Supports 169 are provided on the lower surface of the plate 162 to support a cylinder 170 at their lower ends. A movable block 172 is supported by a rod 171 of the cylinder 170. The movable block 172 is provided at the upper end thereof with pins 173, each of which contacts one end of the corresponding lever 164. The cylinder 170 has a compressed air supply port 174 which is detachably connected with a pipe 175 for supplying and discharging compressed air. Accordingly, as the cylinder 170 is actuated to push up the movable block 172, the levers 164 are pivoted, whereby it is possible to cut a lead 5 of the electronic element 6 between the cutting edges 165.

The element supply unit $C_3$ ($C_{31}$ to $C_{3n}$) supplies special-form elements, such as a socket 7 shown in FIG. 26 which has leads 8 projecting from the center of the bottom surface thereof in a row, and is supplied by being accommodated in a groove 181 cut in a box which is formed with positioning holes 179 as shown in FIG. 27. The element supply unit $C_3$ is, as shown in FIGS. 28 to 32, mounted on a base 182 which is similar to the base 101 for the element supply unit $C_1$. The element supply unit $C_3$ is further provided with a gear 183 which is rotated by a drive mechanism similar to that for the gear 100 of the element supply unit $C_1$. The illustration and description of the drive mechanism are, however, omitted. A rail 185 is supported on a base 184 which is mounted on the base 182. An L-shaped index base 187 is slidably supported on the rail 185 through a slider 186. The index base 187 is formed on one side surface thereof with a multiplicity of projections 188 at a predetermined spacing and is further formed on the other side surface with holes 189 which correspond to the projections 188. A ball plunger 190 is provided on the base 184 such as to face the holes 189. The arrangement is such that a ball 191 of the ball plunger 190 fits in one of the holes 189 thereby to limit the movement of the index base 187. The index base 187 is provided with pins 193 through respective plates 192. The box 180 is positioned and supported by fitting the pins 193 in the corresponding holes 179 in the box 180. At one end of the base 184, a shaft 194 is rotatably supported by laterally extending through the base 184. A gear 195 meshing with the gear 183 is secured to one end of the shaft 194. A flange 196 is secured to the other end of the shaft 194. A slider 199 is slidably supported on guide bars 198 which are supported through a bracket 197 on one of the side surfaces of the base 184. Pins 200 which are respectively provided on the flange 196 and the slider 199 are connected through a link 201 which is rotable in relation to the pins 200. Accordingly, as the flange 196 is rotated, the pin 200 which connects the flange 196 and the link 201 revolves about the axis of the shaft 194, thereby allowing the slider 199 to reciprocate through the link 201. A spring 203 is stretched between pins 202 which are respectively provided on the slider 199 and the base 184 such as to pull the slider 199 in its return direction. A feed pawl 205 which is pivotally supported by a pin 204 provided on the slider 199 is urged such as to pivot by means of a spring 207 stretched between pins 206 which are respectively provided on the slider 199 and the feed pawl 205. The slider 199 is further provided with a stopper pin 208 which serves to limit the rotation of the feed pawl 205. One end of a stopper 209 which is secured to the base 184 is extended such as to oppose the rear end of the feed pawl 205. When the slider 199 returns, the feed pawl 205 abuts against the stopper 209 to pivot, so that the upper end of the feed pawl 205 is located below the lower surface of the base 187. It is, therefore, easy to return the base 187 manually. On the other hand, as the slider 199 advances, the position of the pin 204 moves. In consequence, the feed pawl 205 is pivoted, so that the upper end of the feed pawl 205 engages with one of the projections 188 of the base 187, thereby allowing the base 187 to be fed. It is to be noted that the above-described element supply units $C_1$, $C_2$, $C_3$ may be disposed on the base 101 as desired.

Figure 33:
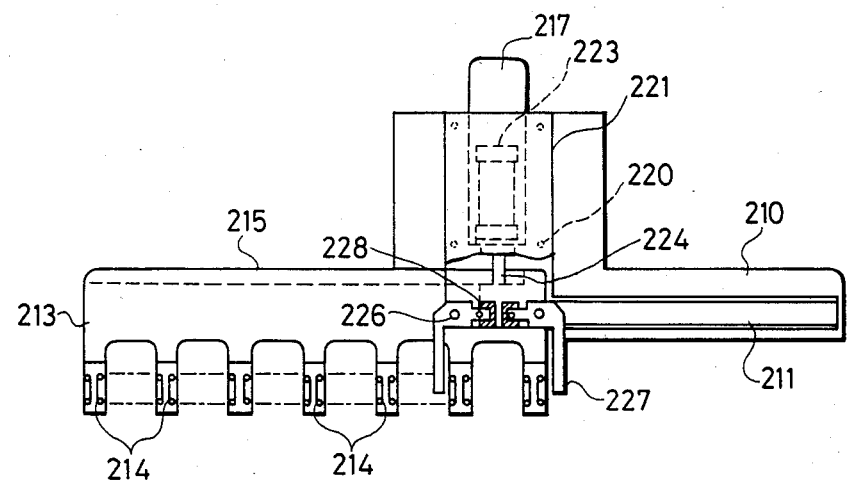
FIG. 33 is a plan view of a chuck exchanging means employed in the apparatus in accordance with the present invention.
Figure 34:
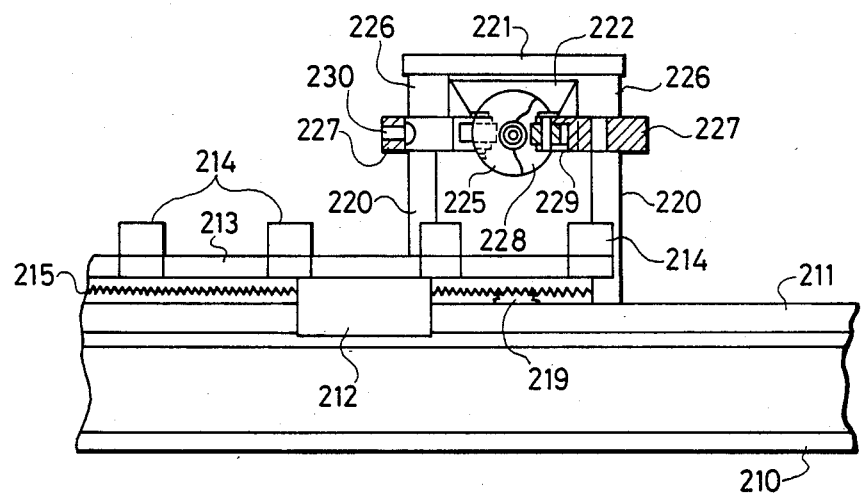
FIG. 34 is a partly-sectioned front elevational view of the chuck exchanging means shown in FIG. 33.
Figure 35:
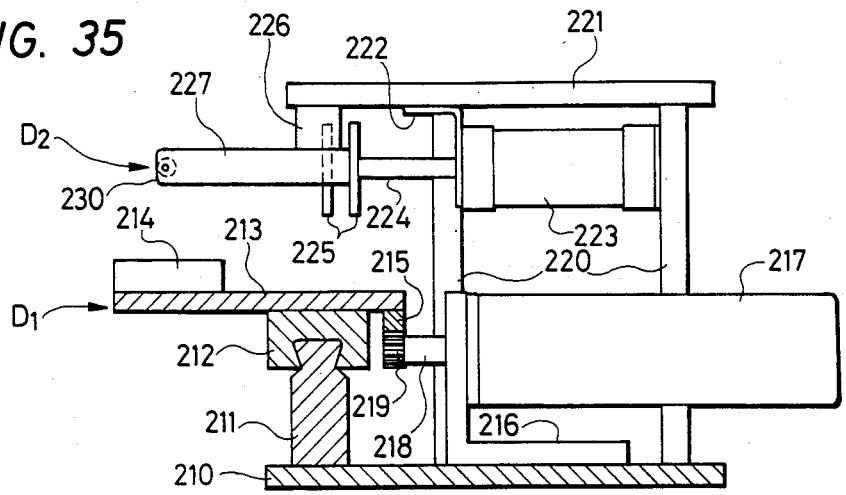
FIG. 35 is a partly-sectioned side elevational view of the chuck exchanging means shown in FIG. 33.
Figure 36:
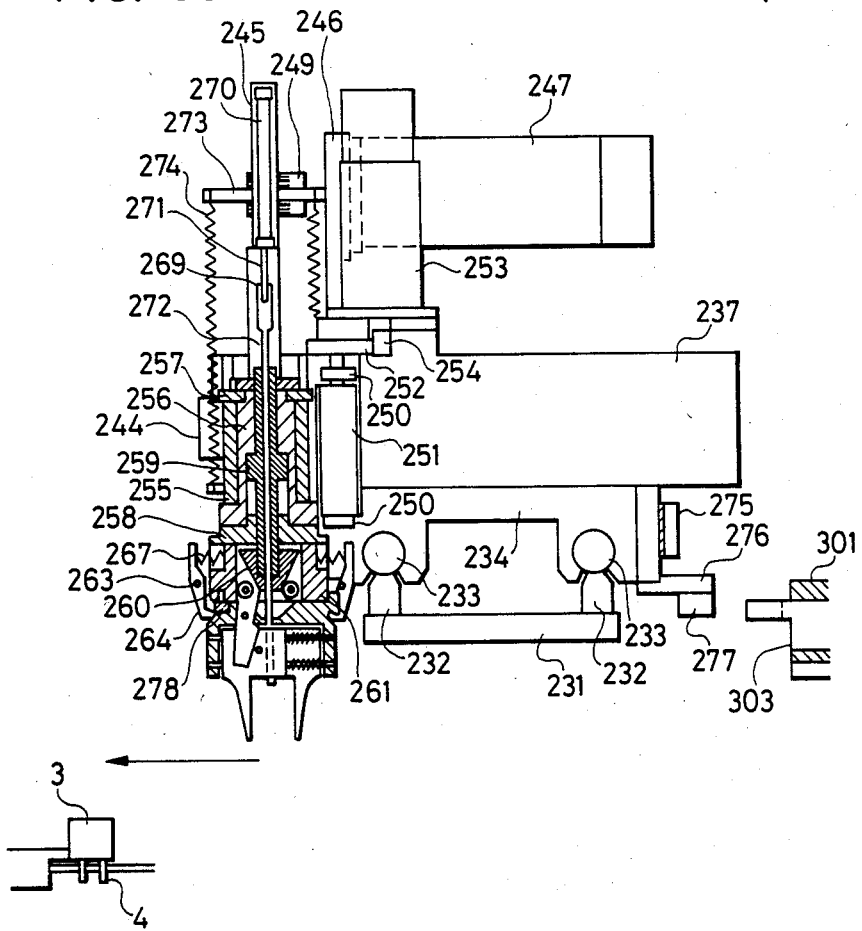
FIG. 36 is a partly-sectioned front elevational view of an inserting head employed in the apparatus in accordance with the present invention.
Figure 37:
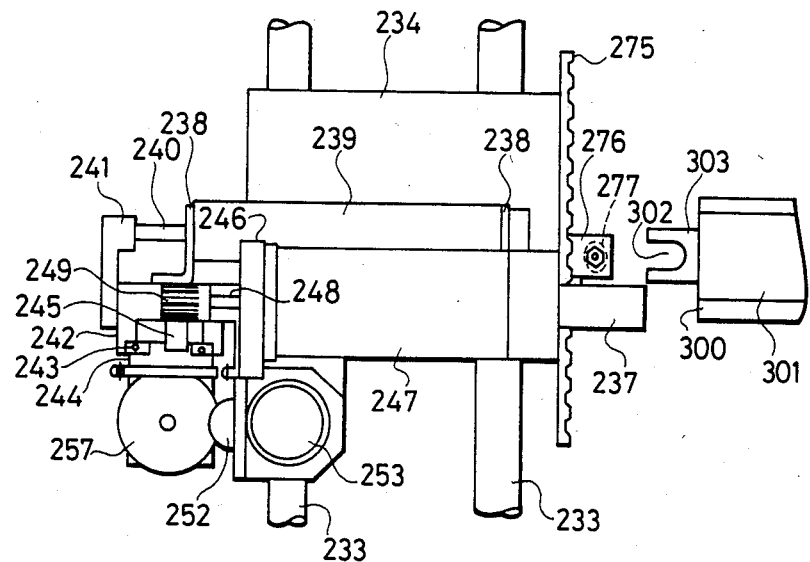
FIG. 37 is a plan view of the inserting head shown in FIG. 36.
Figure 38:
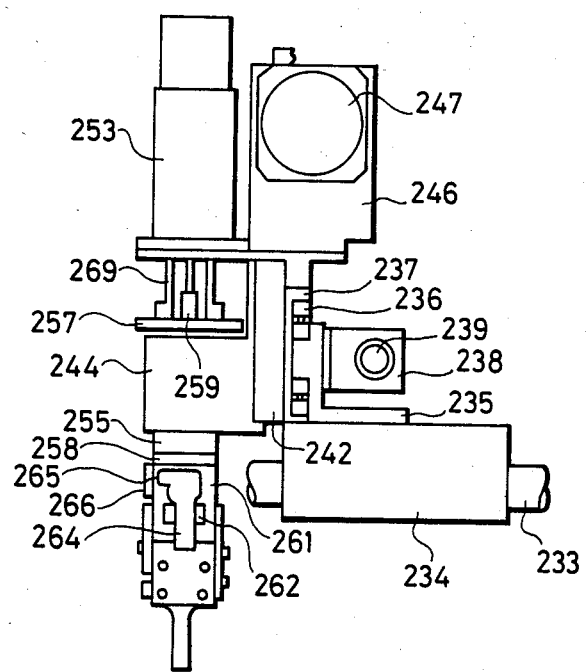
FIG. 38 is a side elevational view of the inserting head shown in FIG. 36.
Figure 39:
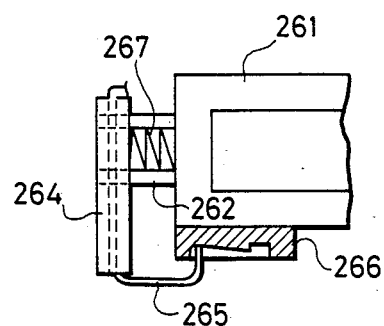
FIG. 39 is an enlarged view of a cam mechanism of the inserting head shown in FIG. 38.
Figure 40:
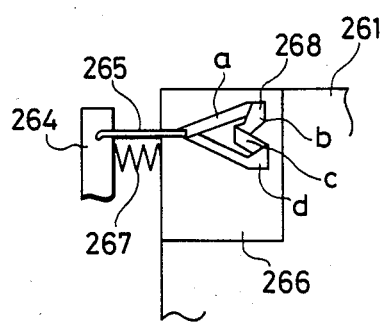
FIG. 40 is a front elevational view of the cam mechanism shown in FIG. 39.
Figure 41:
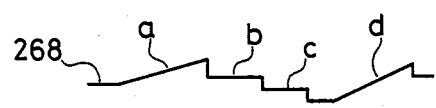
FIG. 41 is a cam diagram.

The chuck exchanging means D is, as shown in FIGS. 33 to 35, composed of a chuck unit $D_1$ which retains a multiplicity of chucks and a chuck exchanging unit $D_2$ which loads and unloads the chucks.

The chuck unit $D_1$ is supported on a base 210 and is disposed at one end of the electronic-element inserting apparatus. A comb-shaped plate 213 is supported by a guide 212 which is slidably fitted on a rail 211 laid on the base 210. On the plate 213 is mounted holders 214 which position and support the chucks. Further, a rack 215 is secured to the lower surface of the plate 213. The rack 215 is meshed with a pinion 219 secured to a rotating shaft 218 of a motor 217 which is supported by a fixing member 216 secured to the base 210. Accordingly, as the motor 217 rotates, the plate 213 slides along the rail 211 through the pinion 219 and the rack 215.

The chuck exchanging unit $D_2$ is supported by the base 210 through supports 220. An upper base 221 is supported on the upper ends of the supports 220. A cylinder 223 is supported on the lower surface of the upper base 221 through a fixing member 222. A pair of disks 225 are attached to the distal end of a rod 224 of the cylinder 223 such as to be spaced with the predetermined distance therebetween. At one end of the upper base 221, a pair of levers 227 are pivotally supported through respective pins 226. One end of each of the levers 227 projects between the disks 225 and rotatably supports a roller 229 through a pin 228. On the other hand, the other end of each lever 227 is provided with a pin 230 having a hemispheric head. Accordingly, as the rod 224 is moved by the operation of the cylinder 223, the levers 227 are pivoted.

The inserting head E is, as shown in FIGS. 36 to 41, supported by a base 231 which is disposed such as to be parallel to the row of element supply positions of the element supply means C and to be located above the element supply means C so that the inserting head E reaches both a chuck exchanging position and an element insertion position. It is to be noted that a pair of inserting heads $E_1$, $E_2$ have the same construction; for this reason, only the inserting head $E_1$ will be described hereinunder. A pair of guide bars 233 are installed in parallel on the base 231 through respective plates 232. The guide bars 233 are slidably fitted with respective bearing portions which are formed on the lower surface of a slide base 234. An L-shaped bracket 235 is secured to the slide base 234. A slide base 237 is supported by the bracket 235 through a linear guide 236 such as to be slidable in the direction perpendicular to the guide bars 233. The bracket 235 further supports through a bracket 238 a cylinder 239, a rod 240 of which is connected to the slide base 237 through a bracket 241. Accordingly, as the cylinder 239 is actuated, the slide base 237 is slid in the direction perpendicular to the guide bars 233. A vertically moving block 244 is slidably supported through a linear guide 243 on a guide portion 242 which is formed on the slide base 237. A rack 245 is secured to the rear surface of the vertically moving block 244. The rack 245 is meshed with a pinion 249 supported by a rotating shaft 248 of a motor 247 which is supported through a bracket 246 at the upper end of the slide base 237. Accordingly, as the motor 247 is actuated, the pinion 249 is rotated, thereby to allow the vertically moving block 244 to move vertically through the rack 245. Integrally connected gears 251, 252 are rotatably supported by the slide base 237 through a pair of bearings 250. A motor 253 is supported by the bracket 246. A gear 254 secured to the rotating shaft of the motor 253 is meshed with the gear 252. Accordingly, the rotation of the motor 53 is transmitted to the gear 251. A cylinder block 256 which is formed with a compressed air supply port (not shown) is rotatably supported by the vertically moving block 244 through a sleeve 255. To the cylinder block 256 is secured a gear 257 which is meshed with the gear 251 such that the cylinder block 256 is rotated by the rotation of the motor 53. A cover 258 is attached to the lower end of the cylinder block 256. A hollow piston 259 is slidably supported by extending through both the cylinder block 256 and the cover 258 such as to be vertically moved by supplying and discharging compressed air through the supply port in the cylinder block 256. A truncated cone-shaped cam 260 is secured to the lower end of the piston 259. A hollow base 261 is attached to the lower surface of the cover 258 such as to surround the cam 260. The hollow base 261 is provided with a pair of levers 264 which are pivotally supported by respective shafts 263 supported by supporting members 262 and are adapted to retain a chuck, described later. The hollow base 261 is further provided with a cam 266 which is engaged by a pin 265 provided on each lever 264, and a spring 267 which applies a pivoting force to each lever 264. The cam 266 is formed with a cam groove 268 which has a configuration such as that shown in FIGS. 40 and 41, such that when the lever 264 oscillates twice, the pin 265 makes one circuit of the cam groove 268. A U-shaped bracket 269 is secured to the upper side of the gear 257. A cylinder 270 is supported by the bracket 269. A rod 271 of the cylinder 270 is connected with a push rod 272 which is slidably received in the piston 259 such as to extend therethrough. Accordingly, the piston 259 and the push rod 272 can be individually operated. A spring 274 is stretched between the verically moving block 244 and an arm 273 which is projected on the bracket 246 such as to negate the loads of the vertically moving block 244 and the chuck F. A timing belt 275 is secured to one of the side surfaces of the slide base 234. The timing belt 275 is stretched between timing pulleys (not shown) which are respectively disposed on the sides of both end portions of the base 231, whereby the inserting head E is slid along the guide bars 233 by the rotations of the timing pulleys. Further, a positioning roller 277 is rotatably supported by the slide base 234 through a bracket 276. It is to be noted that the operation of the roller 277 will be described later. In addition, a pin 278 is provided on the lower surface of the base 261.

Figure 42:
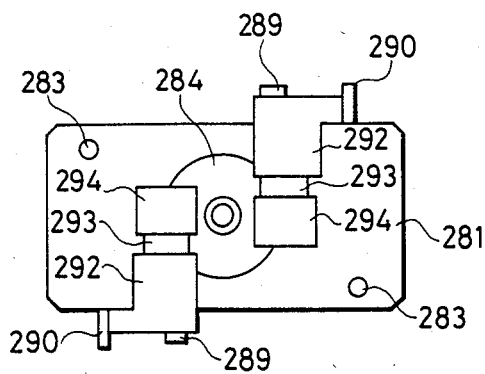
FIG. 42 is a plan view of a chuck employed in the apparatus in accordance with the present invention.
Figure 44:
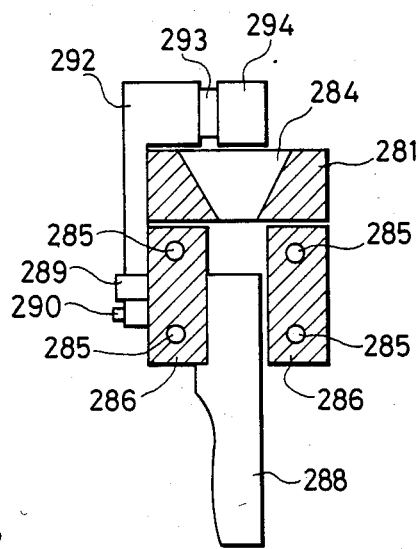
FIG. 44 is a sectional side elevational view of the chuck shown in FIG. 42.
Figure 43:
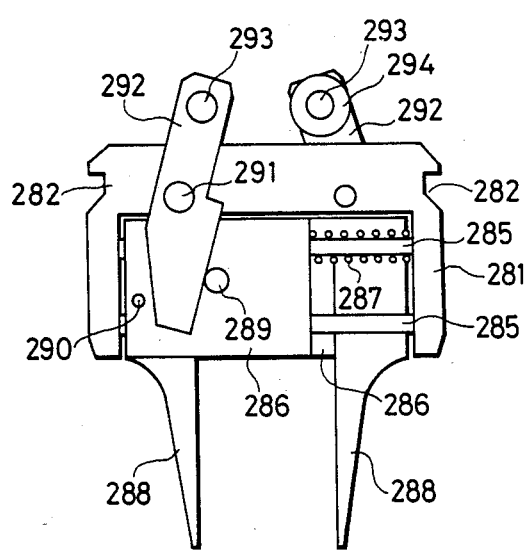
FIG. 43 is a front elevational view of the chuck shown in FIG. 42.

The chuck F is constructed as shown in FIGS. 42 to 44. A U-shaped base 281 has grooves 282 which are respectively formed in the outer side surfaces thereof. On the upper surface of the base 281 are formed small holes 283 which are respectively fitted with the pins 278 and a taper hole 284 which the cam 260 enters. Two pairs of guide bars 285 are supported inside the base 281. A slide block 286 is slidably supported on each pair of guide bars 285. Each slide block 286 is pushed by means of a spring 287 fitted on each guide bar 285 such as to be located at one moving end. Pawls 288 are respectively mounted on the slide blocks 286 such as to oppose each other. Further, each slide block 286 is provided on the outer side surface thereof with pins 289, 290, A lever 292 is pivotally supported through a shaft 291 on each of the longitudinal side surfaces of the based 281. One end of the lever 292 projects between the pins 289, 290, while the other end projects toward the upper side of the taper hole 284 and rotatably supports a roller 294 through a shaft 293. The roller 294 is adapted to contact the cam 260 when the chuck F is supported by the inserting head E such as to transmit the movement of the cam 260 to the lever 292. Further, the pins 290 serve to limit any tilting of their associated levers 292. The pawls 288 are shaped in conformity with the configuration of the elements to be handled.

The chuck F, having the above-described construction, is mounted on each of the holders in the chuck unit $D_1$.

Figure 45:
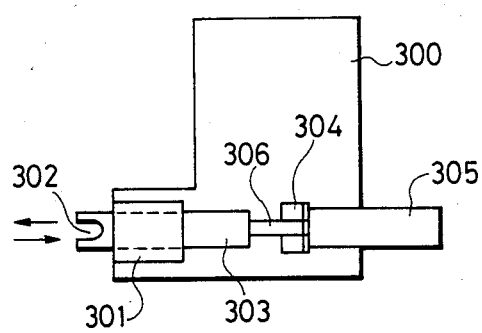
FIG. 45 is a plan view of a head positioning means employed in the apparatus in accordance with the present invention.
Figure 46:
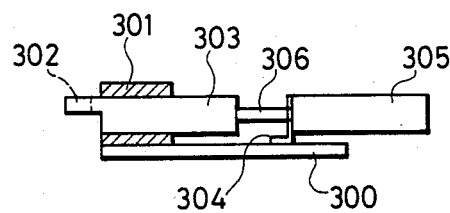
FIG. 46 is a partly-sectioned front elevational view of the head positioning means shown in FIG. 45.

The head positioning means $G_1$ (since the head positioning means $G_2$ has the same construction as that of the means $G_1$, description of the former is omitted) is supported on a base 300 as shown in FIGS. 45 and 46. A slider 303 having a groove 302 formed at one end thereof is slidably supported by a guide 301 which is secured to the base 300. The other end of the slider 303 is connected with a rod 306 of a cylinder 305 which is supported on the base 300 through a bracket 304. Thus, the slider 303 is slid by the operation of the cylinder 305.

The head positioning means $G_1$ is installed close to the element insertion position. When the inserting head E has reached the element insertion position, the cylinder 305 is actuated to project the slider 303 such that the groove 302 is fitted with the roller 277 of the inserting head E, thereby effecting positioning of the inserting head E.

Figure 47:
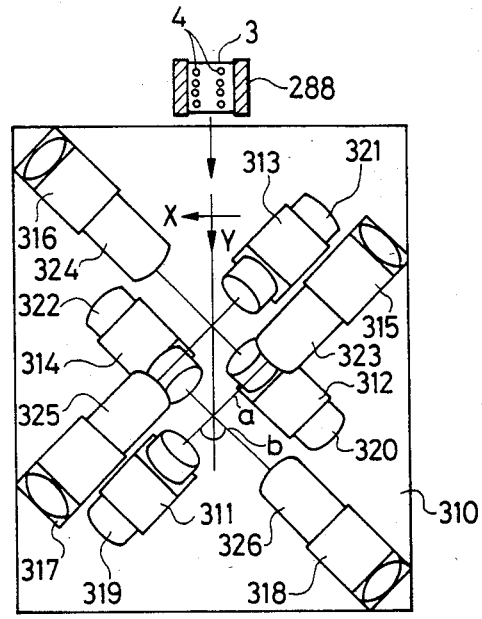
FIG. 47 is a plan view of the sensing unit of a lead wire detecting means employed in the apparatus in accordance with the present invention.
Figure 48:
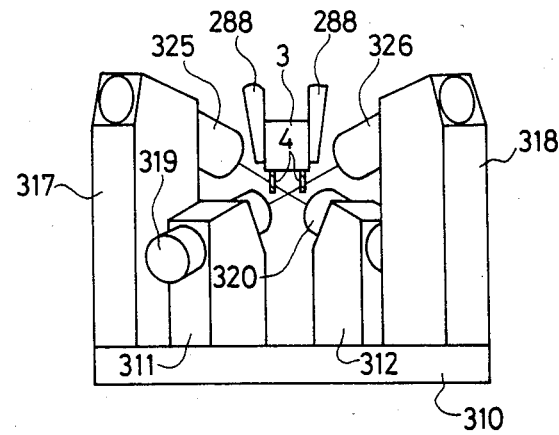
FIG. 48 is a front elevational view of the sensing unit shown in FIG. 47.
Figure 49:
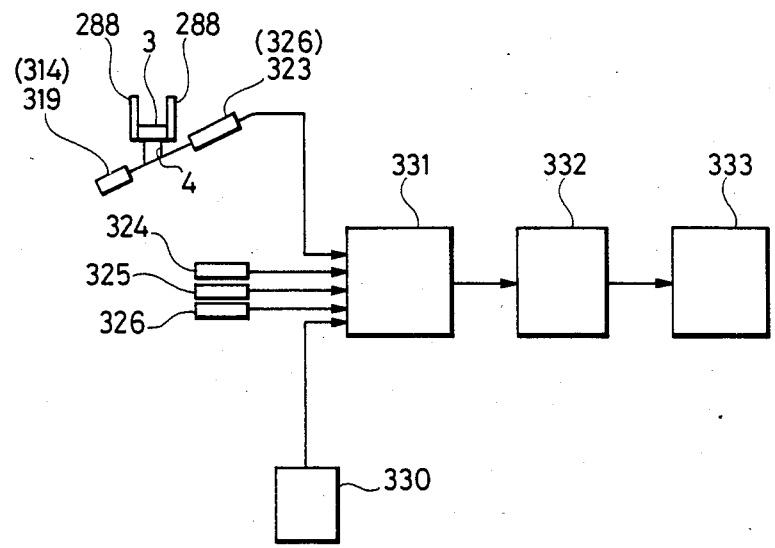
FIG. 49 is a block diagram of the calculating unit of the lead wire detecting means.

The lead detecting means H is, as shown in FIGS. 47 to 49, composed of a lead sensing unit $H_1$ which detects a lead of an element, and a calculating unit $H_2$ which calculates, for example, the position of the lead with respect to the inserting head E from the movement of the inserting head E and the output of the lead sensing unit $H_1$.

The lead sensing unit $H_1$ is disposed along the passage of leads 4 of an element 3 which is transferred from the element supply position to the element insertion position. On a base 310 are provided a first set of four supports 311, 312, 313, 314 and a second set of four supports 315, 316, 317, 318, the first and second sets of supports being different in height from each other. Projectors 319, 320, 321, 322 are respectively supported by the supports 311, 312, 313, 314, while light receivers 323, 324, 325, 326 are respectively supported by the supports 315, 316, 317, 318. The projectors 319, 320, 321, 322 and the light receivers 323, 324, 325, 326 are disposed such as to oppose each other in order that the light beams emitted from the projectors 319, 329, 321, 322 are respectively received by the light receivers 323, 324, 325, 326. In this case, it is preferable to select the diameter of the light beam such that the light beam can be intercepted by the lead 4. The four sets of the projectors 319, 320, 321, 322 and the light receivers 323, 324, 325, 326 are divided into two groups which are disposed such that the light beams which are respectively emitted from the projectors 319, 320 cross each other at right angles and the light beams which are respectively emitted from the projectors 321, 322 cross each other at right angles and further such that the light beams which are respectively emitted from the projectors 319, 321 are located within respective planes which are parallel to each other and the light beams which are respectively emitted from the projectors 320, 322 are located within respective planes which are parallel to each other.

The calculating unit $H_2$ is constituted by a lead sensing circuit 331 and an arithmetic circuit (e.g., a computer) 332. The lead sensing circuit 331 is connected to the light receivers 323, 324, 325, 326 and a rotary encoder (referred to simply as an "encoder", hereinafter) which is attached to the motor (not shown) driving one of the timing pulleys (not shown) having the timing belt 275 of the inserting head $E_1$ stretched therebetween and is adapted to generate a number of pulses corresponding to the rotational angle of the motor. The lead sensing circuit 331 has a counter which counts the pulses applied thereto from the encoder 330, and is adapted to generate a signal representing the contents of the counter on the basis of signals which are respectively applied thereto from the light receivers 323, 324, 325, 326. On the other hand, the arithmetic circuit 332 is adapted to calculate the displacement amount of the lead 4 of the element 3 crossing the lead sensing unit $H_1$. The result of the calculation carried out by the arithmetic circuit 332 is applied to a control circuit 333 which controls a motor (not shown) for moving the X-Y table 10 of the board positioning means A, whereby the position of the X-Y table 10 is corrected such that the position of the hole 2 in the board 1 is aligned with the position at which the lead 4 of the element 3 has arrived.

Figure 50:
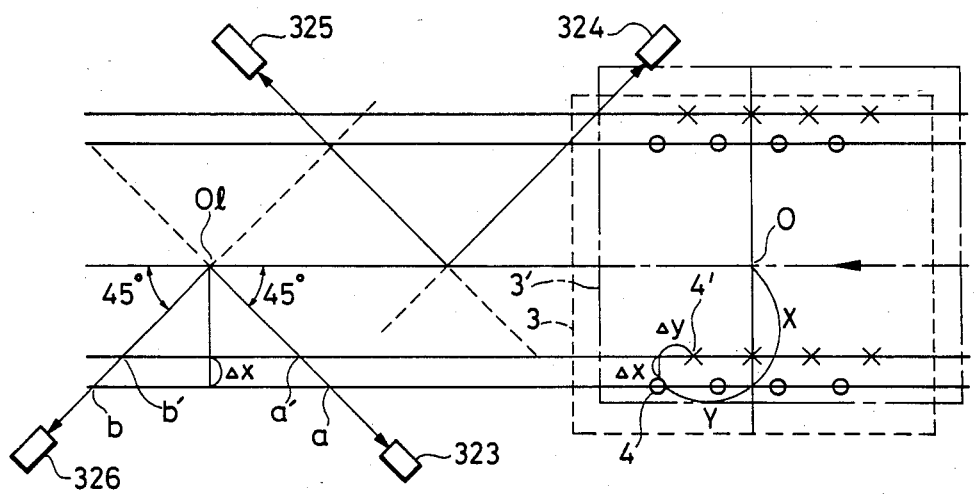
FIG. 50 is an illustration showing the principle of lead wire detection in accordance with the present invention.

The detection of the lead 4 is carried out according to the principle shown in FIG. 50. FIG. 50 shows how the detection of the lead 4 is effected on the left-hand side, in the advancing direction, of the passage of the element 3.

It is assumed that the reference symbol O represents the home position of the detection of the lead 4 of the element 3 which is in an ideal condition; the symbol Ol represents the intersecting point between the light beams; the symbol M represents the distance between the home position O and the intersecting point between the light beams; the symbol X represents the distance between the center of the element 3 and the position of the lead 4 to be measured in the direction (referred to as "X direction", hereinafter) orthogonal to the moving direction of the element 3; the symbol Y represents the distance between the center of the element 3 and the position of the lead 4 to be measured in the direction (referred to as "Y direction", hereinafter) parallel to the moving direction of the element 3; and Na, Nb respectively represent distances between the lead 4 of the element 3 located at the home position O, which is arbitrarily determined, and positions a, b at which the lead 4 crosses the light beams, the distances Na, Nb having previously been set with respect to the position of the lead 4 of the element 3 which is in the ideal position. It is to be noted that the above-described factors in relation to an element 3' to be measured are represented by employing the same reference symbols as those for the factors in relation to the element 3 in the ideal position with the addition of prime to the respective symbols. The displacement amount Δx in the X direction of the lead 4' of the element 3' can be obtained from the following equation:

$$\Delta x = [(Na+Nb)/2] - [(Na'+Nb')/2] \quad (1)$$

On the other hand, the displacement amount Δy in the Y direction can be obtained from the following equation:

$$\Delta y = [(Na'+Nb')/2] + Y - M \quad (2)$$

It is to be noted that it is possible to obtain, in each direction, the displacement amount of the lead on the right-hand side, in the Y direction, of the element 3.

Figure 51:
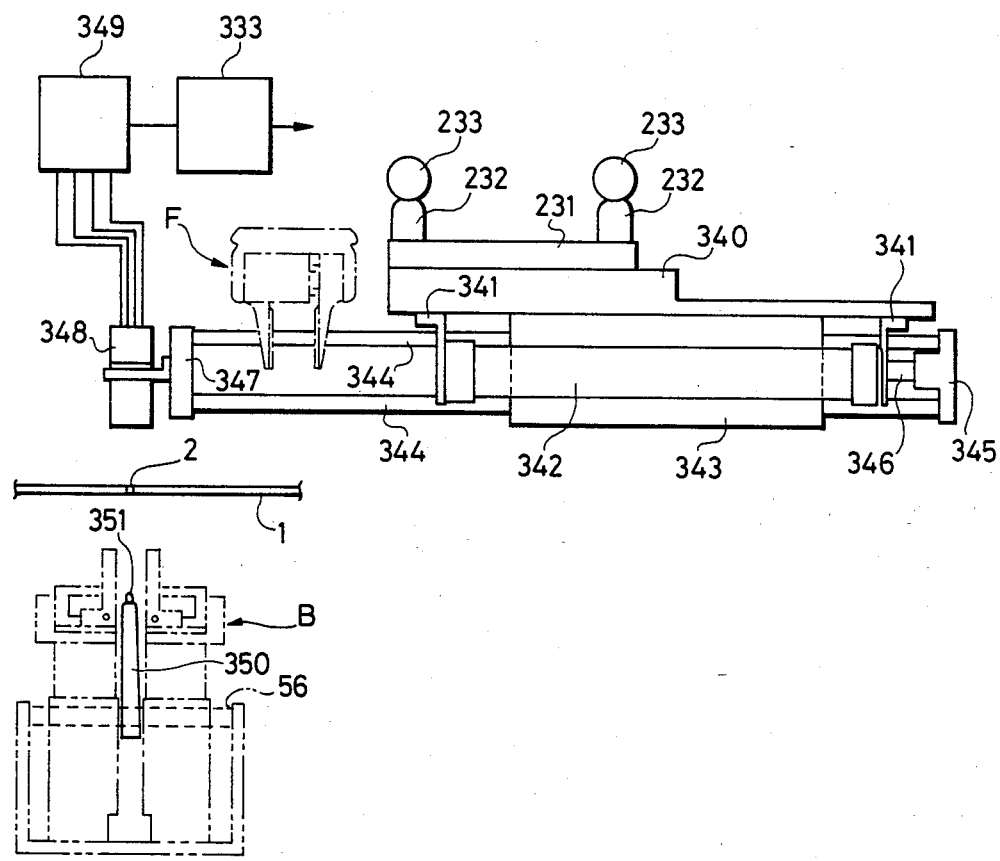
FIG. 51 is a front elevational view of a board hole position detecting means employed in the apparatus in accordance with the present invention.
Figure 52:
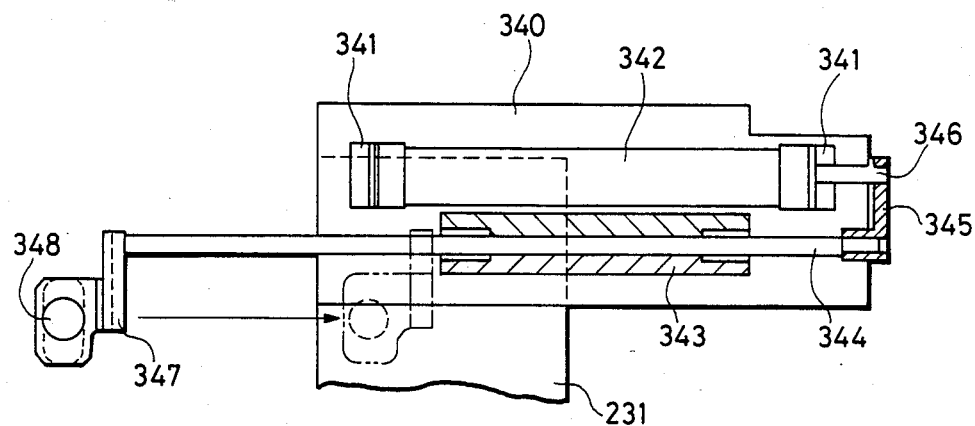
FIG. 52 is a partly-sectioned bottom view of an essential part of the board hole position detecting means shown in FIG. 51.

The board hole position detecting means J is, as shown in FIGS. 51 and 52, supported by the end portion of the base 231 for the inserting head E on the side thereof which is closer to the element insertion position. A base 340 secured to the rear surface of the base 231 supports through a pair of brackets 341 a cylinder 342 and a guide 343 in parallel to the cylinder 342. One end of a pair of shafts 344 slidably supported by the guide 343 is connected to a rod 346 of the cylinder 342. Accordingly, the shafts 344 are reciprocatively slid along the guide 343 by the operation of the cylinder 342. The other ends of the shafts 344 support through a bracket 347 a quartered light-receiving element (referred to simply as a "light-receiving element", hereinafter) 348. The light-receiving element 348 is connected to a measuring circuit 349, the output of which is input to the control circuit 333. On the other hand, a lamp 351 is supported at the upper end of support member 350 which is secured to the center of the guide bars 56 of the tentative fixing means B. The lamp 350 is adapted to be turned on only when the hole position detection is being carried out.

With the above-described construction, when the hole 2 in the board 1 is positioned at the element insertion position, the cylinder 342 is actuated to locate the light-receiving element 348 directly above the lamp 351. Thereupon, the light from the lamp 351 passes through the hole 2 to reach the light-receiving element 348. At this time, signals which respectively represent the intensities of the light received by the four light-receiving areas of the light-receiving element 348 are applied to the measuring circuit 349. The measuring circuit 349 in turn makes comparison between the signals from the light-receiving areas and applies the result of the comparison to the control circuit 333. On the basis of the signal from the measuring circuit 349, the control circuit 333 moves the X-Y table 10 in order to correct the position of the board 1 such that the intensities of the light received by the light-receiving areas of the light-receiving element 348 are equal to each other. Thereafter, the light-receiving element 348 is retracted to its standby position below the base 231 by the operation of the cylinder 342. Under this state, the control circuit 333 further corrects the position of the board 1 on the basis of the signal representing the position of the lead 4 which is applied thereto from the arithmetic circuit 332 of the lead detecting means G.

The inserted condition detecting means K is, as shown in FIG. 53, connected to the motor 247 of the inserting head E. A rotary encoder (referred to simply as an "encoder", hereinafter) 360 is attached to the motor 247. The encoder 360 is adapted to detect the vertical movement of the inserting head E. The motor 247 and the encoder 360 are connected with a control circuit 361, which is adapted to apply a predetermined current to the motor 247 and to detect the current flowing through the motor 247 and the output of the encoder 360. Assuming now that the load of the inserting head E is 0, the output of the motor 247 serves as an inserting force. Thus, controlling the current flowing through the motor 247 makes it possible to control the inserting force. Further, the depth of insertion can be detected from the output of the encoder 360; hence, when a predetermined depth of insertion has been achieved, a signal representing the fact that insertion has been completed is generated. The control circuit 361 is connected to a command circuit 362. The command circuit 362 is adapted to command the control circuit 361 to output a value of current to be supplied to the motor, an element inserting depth (a rotational amount of the encoder 360) and a start signal in correspondence with the element to be inserted. The command circuit 362 sets therein a period of time required for insertion of the element and measures the period of time from the transmission of the start signal to the reception of the insertion completion signal in order to make judgement as to whether or not insertion has been completed within the set time, thereby to judge the result of the inserting operation as either good or bad.

In the above-described construction, the board 1 is fed into the grooves 17 in the rails 16 of the board positioning means A by means of a feed device which is not shown. When the board 1 stops at a fixed position, the cylinder 24 is actuated to raise the guide pins 30 such that they are fitted into the respective positioning holes in the board 1, thereby to effect positioning and fixing of the board 1 in relation to the X-Y table 10. Then, the X-Y table 10 is actuated to move the element insertion position on the board 1 to the position which is accessed by the inserting head E and to fix the board 1 in this position. Thereupon, the cylinder 342 of the board hole detecting means J is actuated to move the light-receiving element 348 to the element insertion position, and the lamp 351 is turned on. In consequence, the light from the lamp 351 passes through the hole 2 in the board 1 to irradiate the surface of the light-receiving element 348 divided into the four light-receiving areas. The light-receiving element 348 generates signals corresponding to the intensities of the light applied to the light-receiving areas. The signals are applied to the measuring circuit 349 thereby to detect any displacement amount of the hole 2 in the board 1. When the result of detection is applied to the control circuit 333, it actuates the X-Y table 10 to move in order to correct the position of the hole 2 in the board 1 such that the signals from the four light-receiving areas of the light-receiving element 348 are equal to each other. Upon completion of positioning of the board 1, the lamp 351 is turned off, and the cylinder 342 is actuated to retract the light-receiving element 348 below the base 231.

Then, the control circuit 333 applies to the tentative fixing means B a signal representing the element 3 (or 6 or 7) to be inserted. Thereupon, the cylinders 51, 52 are actuated to change over the stoppers 49, 50 from one to the other or to retract both of them. Thereafter, the cylinder 45 is actuated to move the rack 43. In consequence, the gear 42 is rotated such as to turn the frame 55, thereby to direct the bending members 85 toward their respective predetermined directions. Then, the motor 39 is actuated to move the cylinder blocks 59 through pinions 57 and the racks 60 thereby to set the distance between the bending members 85 in order to prepare for insertion of the element 3 (or 6 or 7).

On the other hand, the inserting head E moves above the chuck F which is supported by the chuck unit $D_1$ of the chuck exchanging means D. The inserting head E further actuates the cylinder 239 to project the rod 240 in order to push out the slide block 234 so as to move the vertically moving block 244 above the chuck exchanging position. At the same time, the motor 271 of the chuck unit $D_1$ is actuated to move and fix a blank position of the plate 213 to the chuck exchanging position. Under this state, the motor 247 of the inserting head E is actuated to lower the vertically moving block 244 in order to mount the chuck F supported under the base 261 onto the holder 214 of the plate 213. Then, the cylinder 223 of the chuck exchanging unit $D_2$ is actuated to pivot the levers 227. As a result, the levers 227 respectively push the levers 264 of the inserting head E to pivot, thus cancelling the clamping by the chuck F. In this case, the pin 265 of each lever 264 moves within the cam groove 268 from a to b. Thus, when the lever 227 is returned by the operation of the cylinder 223, the pin 265 moves within the cam groove 268 from b to c and is then retained by the starting end of the portion c. Consequently, the levers 264 are held in a state wherein their respective distal ends are open or separate from each other. Under this state, the motor 247 is actuated to pull up the inserting head E, whereby the chuck F is left on the holder 214. Then, the motor 217 is actuated to position the chuck F which is to be used next below the inserting head E. Thereupon, the motor 217 is actuated to lower the base 261 of the inserting head E until the pins 278 projecting from the lower surface of the base 281 are fitted in the respective holes 283 formed in the upper surface of the base 281 of the chuck F. Under this state, the cylinder 223 is actuated to pivot the levers 227 in order to pivot the levers 264 in the respective directions in which their distal ends are open or separate from each other. In consequence, the pin 265 of each lever 264 moves within the cam groove 268 from c to d. When the levers 227 are returned, the levers 264 are pivoted by the urging forces of the respective springs 267 such as to close or move their respective distal ends toward each other. Thus, the levers 264 engage with the respective grooves 282 on the chuck F, thereby to connect the chuck F to the inserting head E. Then, the motor 247 is actuated to raise the inserting head E, whereby the connected chuck F is also raised.

The inserting head E thus supporting the necessary chuck F moves above the supply position for supplying the required element. Thereupon, the motor 247 is actuated to lower the vertically moving block 244 in order to lower the chuck F until the distal ends of the pawls 288 of the chuck F oppose the respective side surfaces of the element 3 (or 6 or 7). Then, compressed air is supplied to the upper side of the piston 259 in the cylinder block 256 to push down the piston 259, thereby to lower the cam 260. Consequently, the distance between the rollers 294 on the chuck F are enlarged by the cam 260. In addition, the levers 292 are pivoted to slide the respective slide blocks 286, thereby allowing the pawls 288 to clamp the element 3 (or 6 or 7).

In the case where the chuck F holds the element 6, the cylinder 170 of the element supply unit $C_2$ is actuated to raise the movable block 172, thereby to pivot the lever 164 such that the lead 5 of the element 6 is cut by the cutting edges 165.

Under this state, the motor 247 is actuated to pull up the vertically moving block 244, whereby the element 3 (or 6 or 7) held by the pawls 288 is raised together with the chuck F and is taken out of the element supply unit $C_1$ (or $C_2$ or $C_3$). Thereupon, the inserting head E holding the element 3 (or 6 or 7) moves toward the element insertion position.

In the element supply unit $C_1$ (or $C_3$) from which the element 3 (or 7) has been taken out, on the other hand, the electromagnetic clutch 99 corresponding to the element 3 (or 7) taken out is actuated to rotate the gear 100 (or 183). Thereupon, the gear 123 (or 195) is rotated to drive the pully 120 (or the flange 196) to move the belt 122 (or the slider 199 through the link 201), thereby to move a subsequent element 3 (or 7) to the element supply position. In the case where the element 6 is taken out, on the other hand, the cylinder 155 of the element supply unit $C_2$ is actuated to turn the ratchet wheel 145 such that the timing belt 141 is rotated by one pitch, thereby to move a subsequent element 6 to the element supply position.

When the lead 4 (or 5 or 8) of the element 3 (or 6 or 7) held by the inserting head E moving toward the element insertion position passes over the lead position detecting means H and intersects the light beams emitted from the projectors 319, 320, 321, 322 of the lead detecting unit $H_1$, respective signals from the light receivers 323, 324, 325, 326 are applied to the lead sensing circuit 333 of the calculating unit $H_2$, and a sensing signal is applied from the lead sensing circuit 331 to the arithmetic circuit 332. Thereupon, the arithmetic circuit 332 calculates the displacement amount of the position of the lead 4 (or 5 or 8) of the element 3 (or 6 or 7) with respect to the position of the lead of the element which is in the ideal condition, and applies the result of calculation to the control circuit 333. The control circuit 333 in turn actuates the X-Y table 10 supporting the board 1 to move on the basis of the displacement amount of the lead 4 (or 5 or 8) which has been applied thereto from the arithmetic circuit 332. Thus, the position of the hole 2 in the board 1 is moved to the position of the lead 4 (or 5 or 8) of the arriving element 3 (or 6 or 7).

The inserting head E, on the other hand, continues its movement and stops when reaching the element insertion position. Thereupon, the cylinder 305 of the head positioning means G is actuated to push out the slider 303 until the groove 302 is fitted with the roller 277, thereby to effect positioning of the inserting head E.

Under this state, the motor 247 of the inserting head E is actuated to lower the vertically moving block 244 in order to lower the chuck F and the element 3 (or 6 or 7). At this time, the inserted condition detecting means K works such as to supply a predetermined current to the motor 247 and to apply a predetermined inserting force to the element 3 (or 6 or 7). Simultaneously with the starting of the motor 247, the measurement of the inserting time is commenced. When the rotational amount of the motor 247 reaches a predetermined amount within a predetermined period of time, a normal insertion is declared, and an insertion completion signal is generated from the command circuit 362. On the other hand, when the predetermined rotational amount is not obtained within the predetermined period of time, the inserting operation is suspended.

When the insertion completion signal is generated, the cylinder 270 is actuated to lower the push rod 272 in order to hold the upper end of the element 3 (or 6 or 7) by the push rod 272. In addition, compressed air is supplied to the lower part of the cylinder block 256 in order to raise the piston 259. Thereupon, the cam 260 is raised to remove the pressure applied to the roller 294 of each lever 292. In consequence, the slide blocks 286 are retracted by the urging forces of the respective springs 287 such as to enlarge the distance between the pawls 288, thereby allowing the element 3 (or 6 or 7) to be released. Under this state, when compressed air is supplied to the lower part of the cylinder block 59 of the tentative fixing means B, the piston 62 pushes up the lifting block 66 such that the upper end of the bending member 85 opposes one of the side surfaces of the lead 4 (or 5 or 8) projecting under the board 1. Then, compressed air is supplied to the lower part of the hole 67 (or the cylinder 81 is actuated) in order to pivot the bending member 85 so as to bend the lead 4 (or 5 or 8). Thereafter, the compressed air in the hole 67 is released (or the cylinder 81 is actuated) to return the bending member 85, and the compressed air supplied to the cylinder block 59 is then released into the atmospheric air to lower the lifting block 66 in order to return the bending member 85 to its standby position. Upon completion of bending of the lead 4 (or 5 or 8) as described above, the motor 247 of the inserting head E is actuated to raise the chuck F. In addition, the cylinder 270 is actuated slightly after the motor 247 is started so as to raise the push rod 72. Then, the cylinder 239 is actuated to return the vertically moving block 244 to the base 231, and thereafter, the inserting head E is returned to the chuck exchanging position or the element supply position.

On the other hand, in the case where insertion has not been completed within a predetermined period of time, the motor 247 is actuated to pull up both the chuck F and the element 3 (or 6 or 7). Thereafter, the cylinder 239 is actuated to return the vertically moving block 244 to the base 231. Then, the inserting head E is moved to a defective element discharging position (not shown), and the element 3 (or 6 or 7) held by the chuck F is removed. Thereafter, the chuck F is returned to the element supply position, and insertion of another element 3 (or 6 or 7) is effected again.

Thus, the elements 3, 6, 7 can be successively inserted. It is to be noted that the inserting order of the elements 3, 6, 7 can be set as desired.

According to the above-described embodiment, the elements can be automatically inserted regardless of the configuration of the elements. Thus, it is possible to greatly increase the extent of automation in insertion of the elements. Further, it is possible to prevent any damage to the elements and the board which are high in cost, since the apparatus is aranged such that if an element cannot be properly inserted owing to insufficient accuracy of the apparatus as a whole or that of the lead of the element, the element will not be damaged and will be replaced with another, and insertion will be re-effected with the new element. Moreover, it is possible to continue the operation without waste of the operator's labor. Furthermore, the apparatus can easily cope with the need for large variety-small lot production. Thus, the present invention offers extremely large industrial advantages.

As has been described above, the present invention advantageously makes it possible to greatly increase the extent of automation of the insertion of elements in the board thereby improving the working efficiency.

What is claimed is:

1. An apparatus for inserting a plurality of differently shaped electronic elements into a corresponding plurality of different holes at different locations throughout a circuit board, with the holes arranged on the circuit board generally in an x-y plane, comprising:
    a board positioning means for sequentially receiving boards fed to it, said board positioning means automatically positioning each of said holes of a board at a fixed insertion position according to a predetermined order by moving said board in both the x and y directions of said plane;
    element supply means having a plurality of element supply units each adapted to feed to a respective fixed element supply position an electronic element to be inserted in said board;
    said element supply units being arranged such that there element supply positions are placed in a rectilinear row parallel to said plane;
    a plurality of chucks differently formed in shape corresponding to the differently shaped electronic elements supplied by said plurality of element supply units;
    an inserting head having holder means for detachably supporting any one of said chucks selectively;
    drive means to reciprocate said inserting head in a straight line between a supply position, fixed chuck exchanging position and said insertion position.

2. An apparatus for inserting electronic elements according to claim 1, further comprising:
    a board hole position detecting means disposed at said insertion position for movement toward and away from a lead inserting hole in said board at said insertion position for detecting a deviation of the inserting hole relative to the insertion position; and
    means for correcting the position of said board to move the inserting hole relative to said insertion position in accordance with the detected hole position by moving the board in said x-y plane to thereby correct the positioning of said board on the basis of detecting a deviation in the inserting hole position.

3. An apparatus for inserting electronic elements according to claim 1, further comprising:
    lead detecting means disposed between said element supply positions and said insertion position, said lead detecting means detecting the position of a lead of an electronic element being held by a chuck within said inserting head as said electronic element is being transferred from its element supply position to said element insertion position during movement of said inserting head; and
    means for correcting the position of said circuit board by moving it in said x-y plane in correlation to said lead detection to thereby correct the position of the corresponding hole relative to the insertion position in correspondence with deviation of the lead to be inserted as determined by said lead detecting means.

4. An apparatus for inserting electronic elements according to claim 3, further comprising:
a board hole position detecting means disposed at said insertion position for movement toward and away from a lead inserting hole in said board at said insertion position for detecting a deviation of the inserting hole relative to the insertion position; and
means for correcting the position of said board to move the inserting hole relative to said insertion position in accordance with the detected hole position by moving the board in said x-y plane to thereby correct the positioning of said board on the basis of detecting a deviation in the inserting hole position.

5. An apparatus for inserting a plurality of differently shaped electronic elements into a corresponding plurality of different holes at different locations throughout a circuit board, with the holes arranged on the circuit board generally in an x-y plane, comprising:
a board positioning means for sequentially receiving boards fed to it, said board positioning means automatically positioning each of said holes of a board at a fixed insertion position according to a predetermined order by moving said board in both the x and y directions of said plane;
element supply means having a plurality of element supply units each adapted to feed to a respective fixed element supply position an electronic element to be inserted in said board;
said element supply units being arranged such that the element supply positions are in a rectilinear row parallel to said plane;
a plurality of chucks differently formed in shape corresponding to the differently shaped electronic elements supplied by said plurality of element supply units;
an inserting head having holder means for detachably supporting any one of said chucks selectively;
drive means to reciprocate said inserting head in a straight line parallel to and adjacent said row of supply positions and between a fixed chuck exchanging position and said insertion position; and
chuck exchanging means including a index-movable chuck holder for receiving said plurality of chucks, and chuck exchanging means for moving said chuck holder to selectively locate each of said chucks at said fixed chuck exchanging position.

6. An apparatus for inserting electronic elements according to claim 5, further comprising:
a board hole position detecting means disposed at said insertion position for movement toward and away from a lead inserting hole in said board at said insertion position for detecting a deviation of the inserting hole relative to the insertion position; and
means for correcting the position of said board to move the inserting hole relative to said insertion position in accordance with the detected hole position by moving the board in said x-y plane to thereby correct the positioning of said board on the basis of detecting a deviation in the inserting hole position.

7. An apparatus for inserting electronic elements according to claim 5, further comprising:
lead detecting means disposed between said element supply positions and said insertion position, said lead detecting means detecting the position of a lead of an electronic element being held by a chuck within said inserting head as said electronic element is being transferred from its element supply position to said element insertion position during movement of said inserting head; and
means for correcting the position of said circuit board by moving it in said x-y plane in correlation to said lead detection to thereby correct the position of the corresponding hole relative to the insertion position in correspondence with deviation of the lead to be inserted as determined by said lead detecting means.

8. An apparatus for inserting electronic elements according to claim 7, further comprising:
a board hole position detecting means disposed at said insertion position for movement toward and away from a lead inserting hole in said board at said insertion position for detecting a deviation of the inserting hole relative to the insertion position; and
means for correcting the position of said board to move the inserting hole relative to said insertion position in accordance with the detected hole position by moving the board in said x-y plane to thereby correct the positioning of said board on the basis of detecting a deviation in the inserting hole position.

9. An apparatus for inserting electronic elements according to claim 8, further comprising:
an inserted condition detecting means attached to said inserting head and adapted to apply a predetermined element-inserting force to said inserting head when an electronic element is inserted and to detect the inserted condition of said element,
wherein the element inserted condition is judged to be good or bad according to whether or not a predetermined depth of insertion is achieved within a predetermined period of time, or whether or not said inserting force reaches a predetermined value within a predetermined period of time.

10. An apparatus for inserting electronic elements according to claim 9, further comprising:
a tentative fixing means disposed at said element insertion position and below said board held by said board positioning means, said tentative fixing means having a pair of bending members which are pivotal within a plane perpendicular to said board such as to bend a lead of an electronic element inserted in said board.

* * * * *